(12) United States Patent
Shibata et al.

(10) Patent No.: US 12,076,890 B2
(45) Date of Patent: Sep. 3, 2024

(54) REPLICA MASTER MOLD, METHOD OF MANUFACTURING REPLICA MASTER MOLD, ARTICLE, AND METHOD OF MANUFACTURING FORMATION OBJECT

(71) Applicant: Dexerials Corporation, Shinagawa-ku Tokyo (JP)

(72) Inventors: Akihiro Shibata, Tokyo (JP); Shunichi Kajiya, Sendai (JP); Kazuya Hayashibe, Sendai (JP); Masanao Kikuchi, Miyagi (JP)

(73) Assignee: Dexerials Corporation, Shinagawa-ku Tokyo (JP)

( * ) Notice: Subject to any disclaimer, the term of this patent is extended or adjusted under 35 U.S.C. 154(b) by 909 days.

(21) Appl. No.: 16/099,692

(22) PCT Filed: Apr. 27, 2017

(86) PCT No.: PCT/JP2017/016780
§ 371 (c)(1),
(2) Date: Nov. 8, 2018

(87) PCT Pub. No.: WO2017/195633
PCT Pub. Date: Nov. 16, 2017

(65) Prior Publication Data
US 2019/0193305 A1 Jun. 27, 2019

(30) Foreign Application Priority Data

May 9, 2016 (JP) .................................. 2016-094103
Aug. 23, 2016 (JP) .................................. 2016-162922

(51) Int. Cl.
*B29C 33/42* (2006.01)
*B29C 33/38* (2006.01)
(Continued)

(52) U.S. Cl.
CPC ............ *B29C 33/424* (2013.01); *B29C 33/38* (2013.01); *B29C 33/3842* (2013.01);
(Continued)

(58) Field of Classification Search
CPC . B29C 59/022; B29C 33/3842; B29C 33/424; B29C 33/38; B29C 33/40;
(Continued)

(56) References Cited

U.S. PATENT DOCUMENTS 8,530,251 B2 * 9/2013 Lee ........................ B29C 43/021
                                                              438/27
8,833,430 B2 * 9/2014 Aizenberg ............ B29C 39/026
                                                              164/6
(Continued)

FOREIGN PATENT DOCUMENTS

CN          1774672 A        5/2006
CN          100545752 C      9/2009
(Continued)

OTHER PUBLICATIONS

Oct. 26, 2020, Office Action issued by the Korean Intellectual Property Office in the corresponding Korean Patent Application No. 10-2018-7032504.
(Continued)

*Primary Examiner* — Monica A Huson
*Assistant Examiner* — Kelsey C Grace
(74) *Attorney, Agent, or Firm* — KENJA IP LAW PC

(57) ABSTRACT

A replica master mold 10 comprises: a base material layer 11; and a surface shape body 12 formed on the base material layer 11 and having a fine irregular pattern, wherein a softening temperature of the surface shape body 12 is higher than a softening temperature of the base material layer 11.

7 Claims, 19 Drawing Sheets

(51) Int. Cl.
  *B29C 59/02* (2006.01)
  *B29C 35/08* (2006.01)
(52) U.S. Cl.
  CPC .... *B29C 59/022* (2013.01); *B29C 2035/0827* (2013.01); *B29C 2059/023* (2013.01); *B29K 2827/06* (2013.01); *B29K 2833/12* (2013.01); *B29K 2867/003* (2013.01); *B29K 2995/0024* (2013.01)
(58) Field of Classification Search
  CPC ....... B29C 2035/0827; B29C 2059/023; G03F 7/0002; B29K 2833/12; B29K 2995/0024; B29K 2827/06; B29K 2867/003
  See application file for complete search history.

(56) References Cited

U.S. PATENT DOCUMENTS

| | | | |
|---|---|---|---|
| 9,713,900 B2* | 7/2017 | Yamada | B82Y 10/00 |
| 2006/0214326 A1 | 9/2006 | Kim et al. | |
| 2012/0133077 A1 | 5/2012 | Mizawa et al. | |
| 2015/0020959 A1* | 1/2015 | Chang | B32B 38/06 |
| | | | 156/219 |

FOREIGN PATENT DOCUMENTS

| | | | |
|---|---|---|---|
| EP | 2210732 A1 | 7/2010 |
| EP | 2711161 A1 | 3/2014 |
| JP | 2003270132 A | 9/2003 |
| JP | 2005016963 A | 1/2005 |
| JP | 2006065302 A | 3/2006 |
| JP | 2007521985 A | 8/2007 |
| JP | 2007245684 A | 9/2007 |
| JP | 2008307856 A | 12/2008 |
| JP | 2009262546 A | 11/2009 |
| JP | 2010036514 A | 2/2010 |
| JP | 2013086294 A | 5/2013 |
| JP | 5276436 B2 | 8/2013 |
| JP | 2015052808 A | 3/2015 |
| KR | 100731736 B1 | 6/2007 |
| KR | 1020100059917 A | 6/2010 |
| TW | 200922774 A | 6/2009 |
| WO | 2005068148 A1 | 7/2005 |
| WO | 2007040339 A1 | 4/2007 |

OTHER PUBLICATIONS

Oct. 30, 2020, Office Action issued by the Taiwan Intellectual Property Office in the corresponding Taiwanese Patent Application No. 106115118.
Jun. 6, 2017, International Search Report issued in the International Patent Application No. PCT/JP2017/016780.
Nov. 8, 2019, the Extended European Search Report issued by the European Patent Office in the corresponding European Patent Application No. 17795994.7.
Feb. 2, 2021, Decision of Refusal issued by the Japan Patent Office in the corresponding Japanese Patent Application No. 2016-162922.
Jun. 16, 2020, Notification of Reasons for Refusal issued by the Japan Patent Office in the corresponding Japanese Patent Application No. 2016-162922.
Jun. 30, 2020, Office Action issued by the China National Intellectual Property Administration in the corresponding Chinese Patent Application No. 201780028736.1.
Nov. 15, 2018, International Preliminary Report on Patentability issued in the International Patent Application No. PCT/JP2017/016780.
Mar. 18, 2022, the Extended European Search Report issued by the European Patent Office in the corresponding European Patent Application No. 21214590.8.
Oct. 13, 2021, Office Action issued by the Taiwan Intellectual Property Office in the corresponding Taiwanese Patent Application No. 110128248.
Aug. 24, 2022, Office Action issued by the China National Intellectual Property Administration in the corresponding Chinese Patent Application No. 202110631466.1.

* cited by examiner

BEFORE PREFORMING

AFTER PREFORMING

BEFORE PREFORMING

AFTER PREFORMING

BEFORE PREFORMING

AFTER PREFORMING

BEFORE PREFORMING

AFTER PREFORMING

BEFORE PREFORMING

AFTER PREFORMING

REPLICA MASTER MOLD, METHOD OF MANUFACTURING REPLICA MASTER MOLD, ARTICLE, AND METHOD OF MANUFACTURING FORMATION OBJECT

CROSS REFERENCE TO RELATED APPLICATION

This application claims priority to and the benefit of Japanese Patent Application No. 2016-094103 filed on May 9, 2016 and Japanese Patent Application No. 2016-162922 filed on Aug. 23, 2016, the entire disclosures of which are incorporated herein by reference.

TECHNICAL FIELD

The present disclosure relates to a replica master mold, a method of manufacturing a replica master mold, an article, and a method of manufacturing a formation object.

BACKGROUND

One of the fine processing technologies is imprint technology by which a master mold having a fine irregular (concave-convex) pattern formed on its surface is prepared and the fine irregular pattern of the master mold is pressed against a resin sheet or the like to transfer the fine irregular pattern of the master mold to the resin sheet. For example, imprint technology is used in the formation of a fine irregular structure for antireflection on a display panel of a smartphone, a tablet terminal, or the like.

Formation objects on which fine structures are formed by imprint have conventionally been approximately planar display panels and the like. In recent years, however, there has been growing demand to form fine structures on three-dimensional formation objects such as three-dimensionally shaped display panels, lens surfaces of camera and the like, and panel surfaces of automotive instruments.

In imprinting, typically, a master mold having a fine irregular pattern corresponding to a fine structure to be formed on a formation object is prepared. A master mold (replica master mold) to which the fine irregular pattern of the master mold has been transferred is then produced, and the fine irregular pattern is transferred to the formation object using the replica master mold.

JP 5276436 B2 (PTL 1) discloses a technique of transferring a fine irregular pattern of a master mold to flexible polymer foil (film) of a cycloolefin copolymer (COC) or the like to produce a polymer stamp (replica master mold) and transferring the fine irregular pattern to a formation object using the polymer stamp. The polymer stamp is formed from flexible polymer foil, and has flexibility. Hence, by softening the film through heating and applying liquid pressure to the polymer stamp, the polymer stamp can be deformed in conformity with the shape of the three-dimensional formation object. The polymer stamp deformed in conformity with the shape of the formation object is then brought into close contact with a photo-curable resin applied onto the formation object, and the photo-curable resin is irradiated with light to be cured. A fine structure can thus be formed on the formation object.

CITATION LIST

Patent Literature

PTL 1: JP 5276436 B2

SUMMARY

Technical Problem

According to PTL 1, the polymer stamp is produced by transferring the fine irregular pattern of the master mold to the flexible polymer foil. That is, the polymer stamp (replica master mold) disclosed in PTL 1 is a single-layer film made of a flexible polymer such as a COC. Therefore, when the polymer stamp is heated to deform in conformity with the shape of the formation object, the irregular portions of the polymer stamp may soften, causing the shape of the fine irregular pattern to be distorted. If the shape of the fine irregular pattern of the replica master mold is distorted, transfer of an accurate fine irregular pattern corresponding to the fine irregular pattern of the master mold is hampered.

It could be helpful to provide a replica master mold, a method of manufacturing a replica master mold, an article, and a method of manufacturing a formation object that can prevent a distortion of a fine irregular pattern in a replica master mold and suppress a decrease in transfer accuracy.

Solution to Problem

A replica master mold according to the present disclosure comprises: a base material layer; and a surface shape body formed on the base material layer and having a fine irregular pattern, wherein a softening temperature of the surface shape body is higher than a softening temperature of the base material layer.

Preferably, in the replica master mold according to the present disclosure, the base material layer has flexibility.

Preferably, in the replica master mold according to the present disclosure, the base material layer and the surface shape body are fixed by an intermediate layer composed of one or more layers.

Preferably, in the replica master mold according to the present disclosure, a release layer is formed on a surface of the fine irregular pattern of the surface shape body.

Preferably, in the replica master mold according to the present disclosure, the surface shape body is made of an inorganic compound.

Preferably, in the replica master mold according to the present disclosure, the base material layer has an elongation percentage of 10% or more.

Preferably, the replica master mold according to the present disclosure has a curved surface whose curvature radius is greater than a height of the fine irregular pattern.

A method of manufacturing a replica master mold having a curved surface comprises: heating the replica master mold to higher than or equal to the softening temperature of the base material layer; and deforming the heated replica master mold to have the curved surface whose curvature radius is greater than the fine irregular pattern.

An article according to the present disclosure comprises a fine structure formed by transfer using the replica master mold or by attachment of the replica master mold.

A method of manufacturing a formation object according to the present disclosure is a method of manufacturing a formation object having a fine structure formed thereon, and comprises: preparing a replica master mold that includes a base material layer and a surface shape body formed on the base material layer and having a fine irregular pattern corresponding to the fine structure, a softening temperature of the surface shape body being higher than a softening temperature of the base material layer; heating the replica master mold to a temperature higher than or equal to the softening temperature of the base material layer and lower than the softening temperature of the surface shape body, to deform the replica master mold in conformity with a shape of the formation object; and forming the fine structure on the formation object, by transfer using the replica master mold or by attachment of the replica master mold.

Advantageous Effect

A replica master mold, a method of manufacturing a replica master mold, an article, and a method of manufacturing a formation object according to the present disclosure can prevent a distortion of a fine irregular pattern in a replica master mold and suppress a decrease in transfer accuracy.

DETAILED DESCRIPTION

Figure 1:
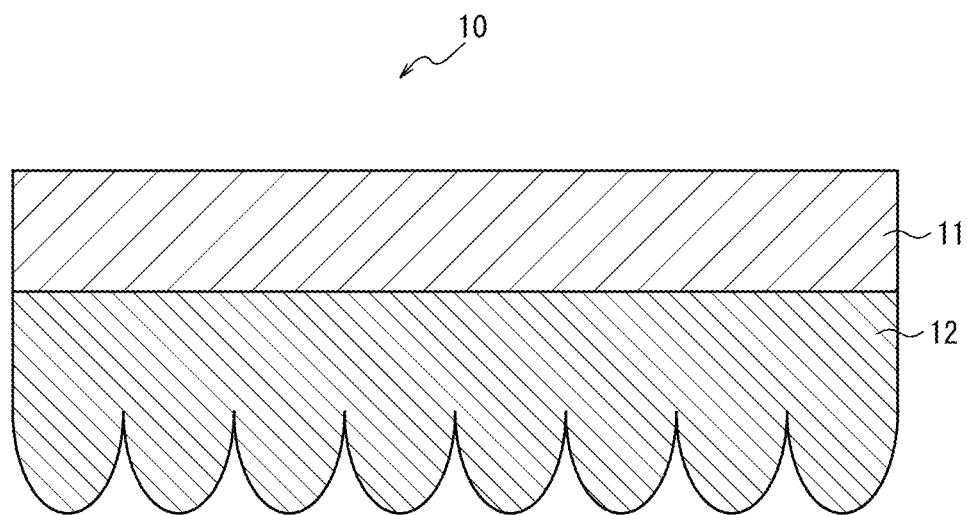
FIG. 1 is a diagram illustrating an example of the structure of a replica master mold according to one of the disclosed embodiments.

One of the disclosed embodiments is described below, with reference to drawings. Note that the present disclosure is not limited to the following embodiment, and various modifications are possible within the scope of the present disclosure. In the drawings, the same reference signs represent the same or similar components.

(Structure of Replica Master Mold)

FIG. 1 is a diagram illustrating an example of the structure of a replica master mold 10 according to one of the disclosed embodiments.

The replica master mold 10 illustrated in FIG. 1 includes a base material layer 11 and a surface shape body 12.

The base material layer 11 is a sheet-shaped base material, and has flexibility and also desirably has a sufficient elongation percentage (e.g. 10% or more) to deform in conformity with the shape of a three-dimensional formation object. The thickness of the base material layer 11 is preferably thin, so as to deform in conformity with the shape of the three-dimensional formation object. The thickness of the base material layer 11 is preferably 500 μm or less, and more preferably 100 μm or less. Herein, "having flexibility" means being able to be bent and flexed by human hand. Herein, the "elongation percentage" can be determined, for example, by the following method.

A base material to be measured is made into a strip of 10.5 cm in length and 2.5 cm in width, as a measurement sample. The tensile elongation percentage of the obtained measurement sample is measured using a tensile tester (Autograph AG-5kNXplus produced by Shimadzu Corporation) (measurement conditions: tension rate=100 mm/min; inter-chuck distance=8 cm). In the measurement of the elongation percentage, the measurement temperature differs depending on the type of the base material. The elongation percentage is measured at a temperature close to or not lower than the softening point of the base material. In detail, the temperature is 10° C. to 250° C. For example, in the case where the base material is polycarbonate or a PC/PMMA laminate, the elongation percentage is preferably measured at 190° C.

The base material layer 11 is made of, for example, polymethyl methacrylate (PMMA), polycarbonate (PC), polyvinyl chloride (PVC), polyvinyl alcohol (PVA), polyethylene (PE), amorphous polyethylene terephthalate (APET), polystyrene (PS), triacetyl cellulose (TAC), cyclic olefin polymer (COP), polyethylene terephthalate (PET), or the like. In terms of the process steps after the manufacture of the replica master mold 10, the base material layer 11 is preferably made of PMMA, PC, PVC, TAC, or the like.

The surface shape body 12 is formed on the base material layer 11 and has a predetermined thickness. A fine irregular pattern is formed on the surface of the surface shape body 12. The surface shape body 12 is made of a resin curable by active energy rays, such as a polymer of an acrylate monomer, a methacrylate monomer, or the like. The surface shape body 12 may be made of an inorganic compound. The surface shape body 12 is made of such a material whose softening temperature is higher than the softening temperature of the base material layer 11. The softening temperature is a temperature at which a film softens and deforms by pressure application or the like, and corresponds to a storage elastic modulus (E') of 0.3 GPa or less in dynamic viscoelasticity measurement (DMA measurement).

In the replica master mold 10 according to this embodiment, the softening temperature of the surface shape body 12 is higher than the softening temperature of the base material layer 11. Therefore, even in the case where the base material layer 11 is heated to its softening temperature in order to deform the replica master mold 10 in conformity with the shape of the three-dimensional formation object, the surface shape body 12 does not soften. It is thus possible to prevent a distortion of the fine irregular pattern of the surface shape body 12 and suppress a decrease in transfer accuracy.

The structure of the replica master mold 10 is not limited to that illustrated in FIG. 1. As an example, the replica master mold 10 may have a structure in which an intermediate layer 13 as a binder layer is formed approximately flat between the base material layer 11 and the surface shape body 12 to fix the base material layer 11 and the surface shape body 12 having the fine irregular pattern, as illustrated in FIG. 2.

Figure 3A:
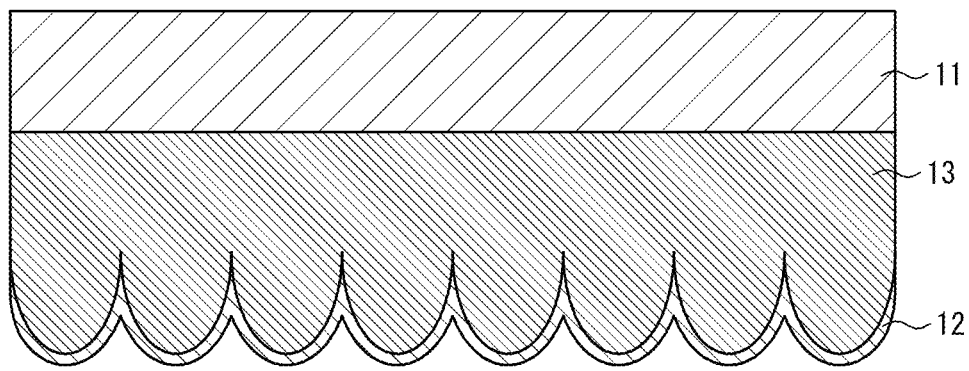
FIG. 3A is a diagram illustrating another example of the structure of the replica master mold according to one of the disclosed embodiments.
Figure 3B:
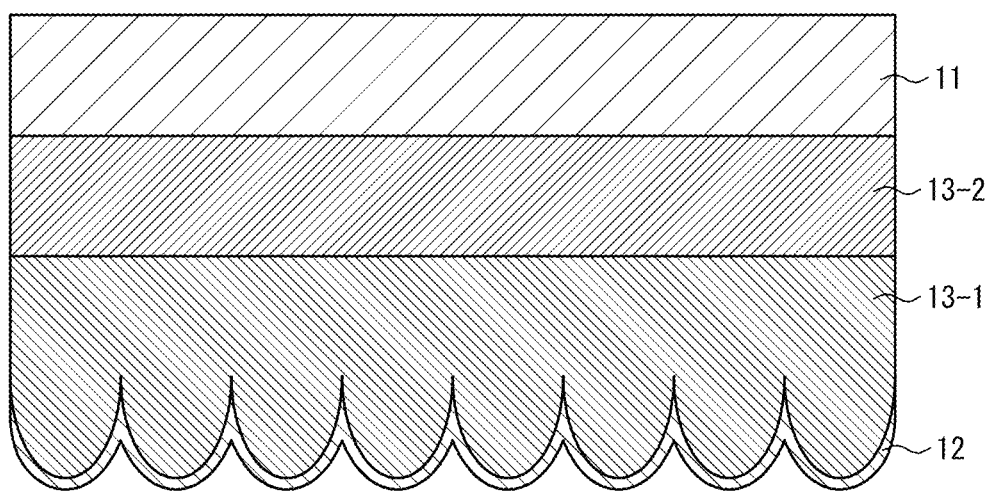
FIG. 3B is a diagram illustrating another example of the structure of the replica master mold according to one of the disclosed embodiments.

As another example, the replica master mold 10 may have a structure in which the intermediate layer 13 having a predetermined thickness and the fine irregular pattern is formed on the base material layer 11 and the surface shape body 12 is formed so as to cover the surface of the intermediate layer 13, as illustrated in FIG. 3A. The intermediate layer 13 may be composed of a plurality of layers, as illustrated in FIG. 3B. In FIG. 3B, an approximately flat intermediate layer 13-2 is formed on the base material layer 11, and an intermediate layer 13-1 having a predetermined thickness and the fine irregular pattern is formed on the intermediate layer 13-2. The surface shape body 12 is formed so as to cover the surface of the intermediate layer 13-1.

Figure 2:
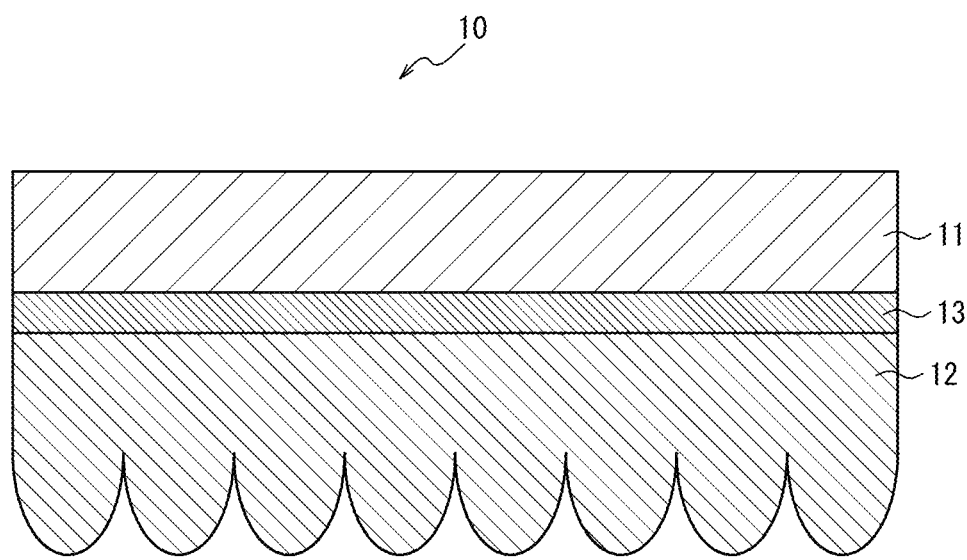
FIG. 2 is a diagram illustrating another example of the structure of the replica master mold according to one of the disclosed embodiments.

As illustrated in FIGS. 2, 3A, and 3B, the provision of the intermediate layer 13 can improve the adhesiveness between the base material layer 11 and the surface shape body 12 and improve the optical characteristics. The intermediate layer 13 is made of, for example, PC, an acrylate monomer having resin penetrability, or a multifunctional oligomer of urethane series or the like.

To enhance releasability, a layer made of an acrylic monomer containing fluorine or silicone or a layer made of an oxide may be formed on the surface of the surface shape body 12, as a release layer. By depositing an oxide on the surface of the surface shape body 12, a distortion of the fine irregular pattern of the surface shape body 12 can be prevented more reliably.

(Overview of Formation of Fine Structure on Formation Object Using Replica Master Mold)

An overview of the formation of a fine structure using the replica master mold 10 is given below, with reference to FIGS. 4A to 4D. In the following description, it is assumed that a formation object on which a fine structure is to be formed has, for example, a convex surface like a convex lens, and the fine structure is formed on the convex surface.

Figure 4A:
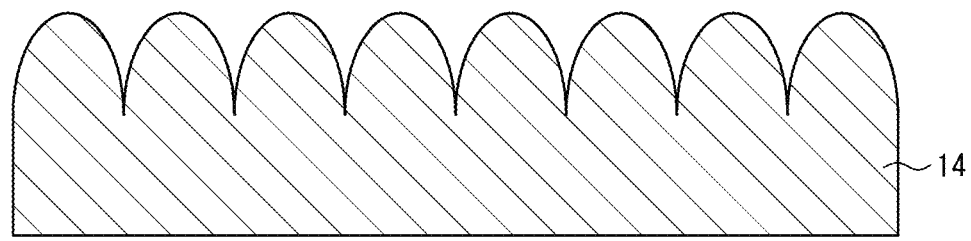
FIG. 4A is a diagram schematically illustrating the formation of a fine structure using the replica master mold illustrated in FIG. 1.

First, as illustrated in FIG. 4A, a master mold 14 having a fine irregular pattern corresponding to the fine structure to be formed on the formation object is manufactured. The master mold 14 is manufactured by a known manufacturing method for a master mold for imprint. For example, a resist layer is formed on a quartz plate, and irradiated with light (exposed to light) according to the fine irregular pattern to be formed. Following this, a developer is applied onto the resist layer, and the resist layer is developed to form a resist pattern corresponding to the fine irregular pattern on the resist layer. Etching is then performed using, as a mask, the resist layer on which the resist pattern is formed, to form the fine irregular pattern on the quartz plate. The master mold 14 is not limited to a plate shape, and may have a roll shape.

Figure 4B:
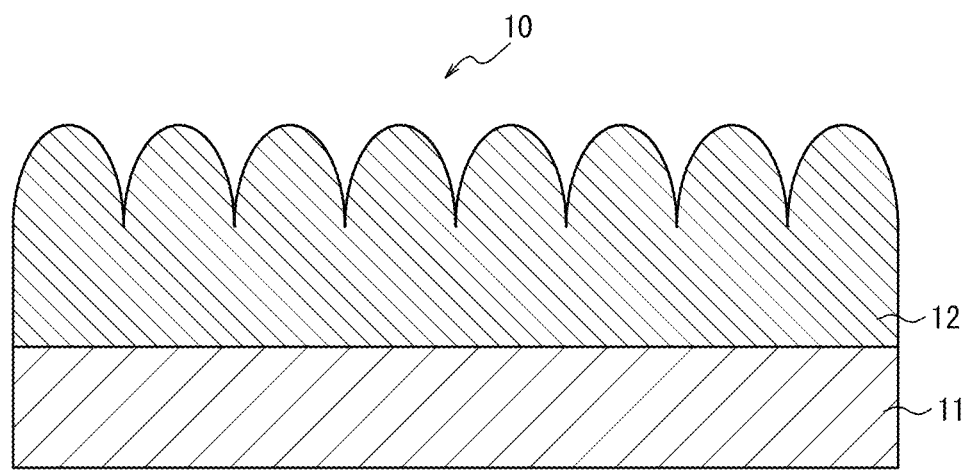
FIG. 4B is a diagram schematically illustrating the formation of a fine structure using the replica master mold illustrated in FIG. 1.

Next, the replica master mold 10 illustrated in FIG. 4B is manufactured using the master mold 14. In the manufacture of the replica master mold 10 using the master mold 14, for example, an uncured photo-curable resin is sandwiched between the master mold 14 and the base material layer 11, and then irradiated with light (ultraviolet light) to be cured. By sandwiching the uncured photo-curable resin between the master mold 14 and the base material layer 11, the fine irregular pattern of the master mold 14 is transferred to the uncured photo-curable resin. The uncured photo-curable resin is then irradiated with ultraviolet light, and thus cured in a state in which the fine irregular pattern has been transferred. After this, the master mold 14 is released from the cured photo-curable resin. The cured photo-curable resin serves as the surface shape body 12. The replica master mold 10 in which the surface shape body 12 having the fine irregular pattern is formed on the base material layer 11 can thus be manufactured.

With the method described above, the fine irregular pattern formed on the surface shape body 12 is inversion of the fine irregular pattern formed on the master mold 14. This is, however, not a limitation. For example, the replica master mold 10 including the surface shape body 12 having the same fine irregular pattern as the fine irregular pattern of the master mold 14 can be manufactured by transferring the fine irregular pattern of the master mold 14 to another transfer object, transferring the fine irregular pattern that has been transferred to the other transfer object to the uncured photo-curable resin, and then curing the photo-curable resin to form the surface shape body 12.

Instead of the above-mentioned method (light transfer method) of pressing the master mold 14 against the uncured photo-curable resin and then curing the photo-curable resin, a thermal transfer method using a thermosetting resin may be used to manufacture the replica master mold 10. The process of manufacturing the replica master mold 10 will be described in detail later.

Figure 4C:
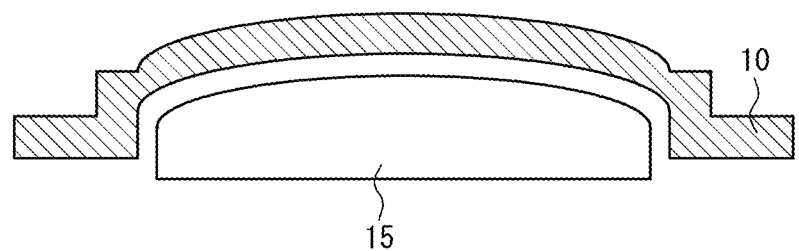
FIG. 4C is a diagram schematically illustrating the formation of a fine structure using the replica master mold illustrated in FIG. 1.

After separating the replica master mold 10 from the master mold 14, the replica master mold 10 is heated, and pressed against a die 15 that conforms to the shape of the formation object, as illustrated in FIG. 4C. As a result, the replica master mold 10 deforms (preforms) in conformity with the shape of the die 15, i.e. the shape of the formation object. Here, the replica master mold 10 is pressed against the die 15, with the surface shape body 12 facing the die 15. The process illustrated in FIG. 4C (process of deforming the replica master mold 10) will be described in detail later.

Figure 4D:
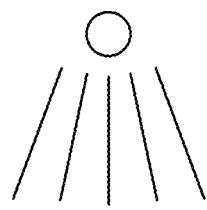
FIG. 4D is a diagram schematically illustrating the formation of a fine structure using the replica master mold illustrated in FIG. 1.
Figure 4D:
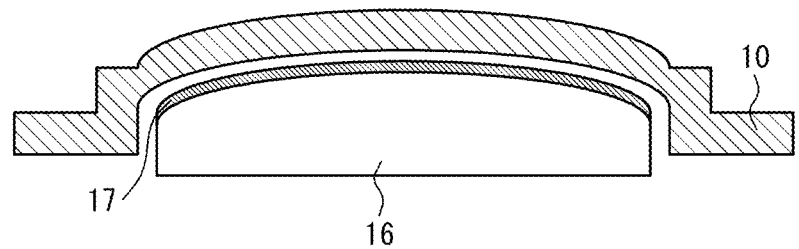

Next, as illustrated in FIG. 4D, an uncured photo-curable resin 17 is applied to the surface of a formation object 16, and the replica master mold 10 deformed in conformity with the shape of the die 15 (formation object 16) is pressed against the photo-curable resin 17 with the surface shape body 12 facing the photo-curable resin 17. As a result of the surface shape body 12 being pressed against the uncured photo-curable resin 17, the fine irregular pattern of the surface shape body 12 is transferred to the photo-curable resin 17. The uncured photo-curable resin 17 is then irradiated with light (ultraviolet light) to be cured, thus forming the fine structure on the formation object 16.

(Process of Manufacturing Replica Master Mold)

The process of manufacturing the replica master mold 10 illustrated in FIG. 4B is described in detail below, with reference to FIGS. 5A and 5B.

The following describes not the above-mentioned light transfer method, but a method by which the resin is softened by heating and the master mold 14 is pressed against the softened resin to transfer the fine irregular pattern formed on the master mold 14 to the softened resin.

The process of manufacturing the replica master mold 10 mainly includes a heating step, a transfer step, and a release step.

Figure 5A:
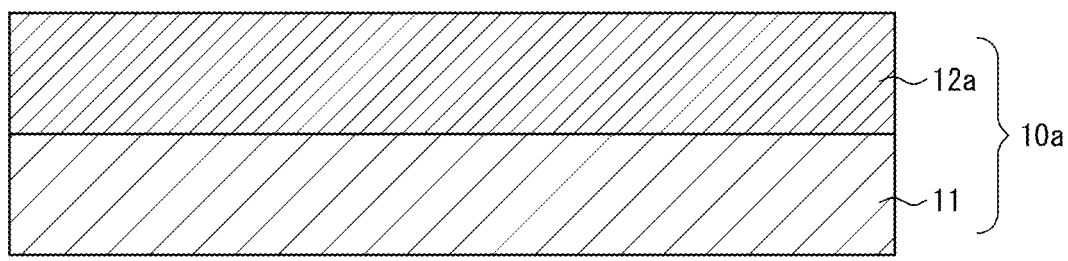
FIG. 5A is a diagram illustrating a step in a process of manufacturing the replica master mold illustrated in FIG. 4B.

First, as illustrated in FIG. 5A, a laminate 10a in which an approximately flat resin layer 12a is formed on the base material layer 11 is prepared. The resin layer 12a is made of the same material as the surface shape body 12. The softening temperature of the resin layer 12a is therefore higher than the softening temperature of the base material layer 11.

In the heating step, the laminate 10a is heated until the resin layer 12a softens. Examples of the heating method include conduction heating by contact with a high-temperature body, convection heating by convection of a high-temperature fluid, and radiation heating using infrared light (IR) or the like.

Figure 5B:
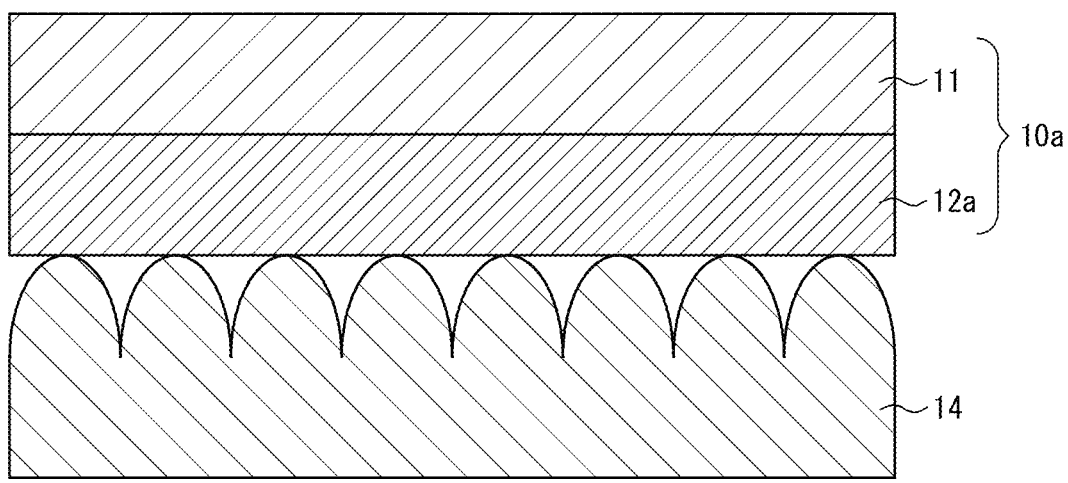
FIG. 5B is a diagram illustrating a step in the process of manufacturing the replica master mold illustrated in FIG. 4B.

In the transfer step, the heated resin layer 12a is pressed against the master mold 14, as illustrated in FIG. 5B. By pressing the heated resin layer 12a against the master mold 14, the fine irregular pattern formed on the master mold 14 is transferred to the resin layer 12a. Examples of the method of pressing the resin layer 12a against the master mold 14 include fluid pressurization using gas or liquid, and clamping the ends of the laminate 10a and pressing it against the master mold 14. In the heating step, the laminate 10a is heated until the resin layer 12a softens. This means the base material layer 11 whose softening temperature is not higher than the softening temperature of the resin layer 12a has softened, too. Accordingly, with the use of vacuum forming, pressure forming, TOM (Three dimension Overlay Method) forming, or the like, the base material layer 11 follows the shape of the master mold 14. This enables the transfer of the fine irregular pattern to the resin layer 12a in a more reproducible manner.

In the release step, the laminate 10a after the transfer step is cooled, to cure the base material layer 11 and the resin layer 12a. Following this, the master mold 14 is separated from the resin layer 12a. As a result, the replica master mold 10 in which, on the base material layer 11, the resin layer 12a to which the fine irregular pattern of the master mold 14 has been transferred is formed as the surface shape body 12 is obtained.

(Deformation of Replica Master Mold)

The process of deforming the replica master mold 10 illustrated in FIG. 4C is described in detail below, with reference to FIGS. 6A to 6E. The following describes a process of deforming the replica master mold 10 by push-up forming.

Figure 6A:
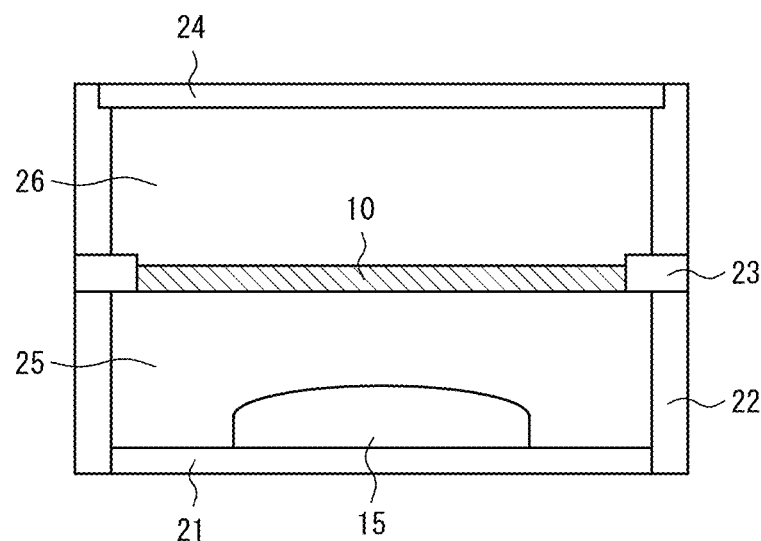
FIG. 6A is a diagram illustrating a step in a process of deforming the replica master mold illustrated in FIG. 4C.

First, as illustrated in FIG. 6A, the die 15 that conforms to the shape of the formation object 16 is placed on a stage 21. The stage 21 has sidewalls 22 on its periphery, and is movable along the sidewalls 22 (movable vertically in FIG. 6A). Each sidewall 22 is provided with a support 23 for supporting the replica master mold 10. The supports 23 support the replica master mold 10 so as to face the die 15. The replica master mold 10 is supported with the surface shape body 12 facing the die 15. On the side of the replica master mold 10 supported by the supports 23 opposite to the die 15, a quartz plate 24 supported by the sidewalls 22 and facing the stage 21 is provided. The quartz plate 24 allows light to pass through. The stage 21, the sidewalls 22, the supports 23, and the quartz plate 24 are arranged so as to seal a region 25 surrounded by the stage 21, the sidewalls 22, and the replica master mold 10 supported by the supports 23 and seal a region 26 surrounded by the quartz plate 24, the sidewalls 22, and the replica master mold 10 supported by the supports 23.

The replica master mold 10 supported by the supports 23 is heated to a temperature higher than or equal to the softening temperature of the base material layer 11 and lower than the softening temperature of the surface shape body 12. As mentioned above, the softening temperature of the surface shape body 12 is higher than the softening temperature of the base material layer 11. Accordingly, the base material layer 11 softens, but the surface shape body 12 does not soften. Hence, no distortion of the shape of the fine irregular pattern formed on the surface of the surface shape body 12 occurs.

Figure 6B:
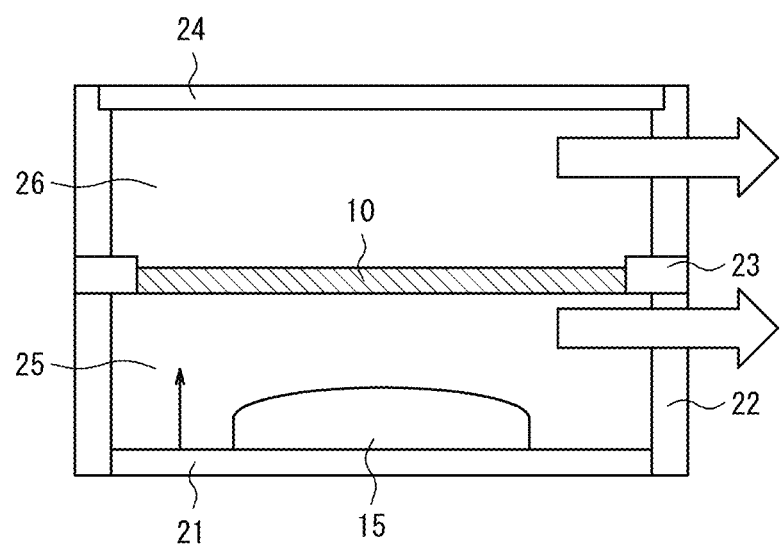
FIG. 6B is a diagram illustrating a step in the process of deforming the replica master mold illustrated in FIG. 4C.

Next, as illustrated in FIG. 6B, the regions 25 and 26 are vacuumed. The stage 21 is movable vertically along the sidewalls 22, as mentioned above. As a result of vacuuming the region 25, the stage 21 moves upward (i.e. toward the replica master mold 10 supported by the supports 23).

Figure 6C:
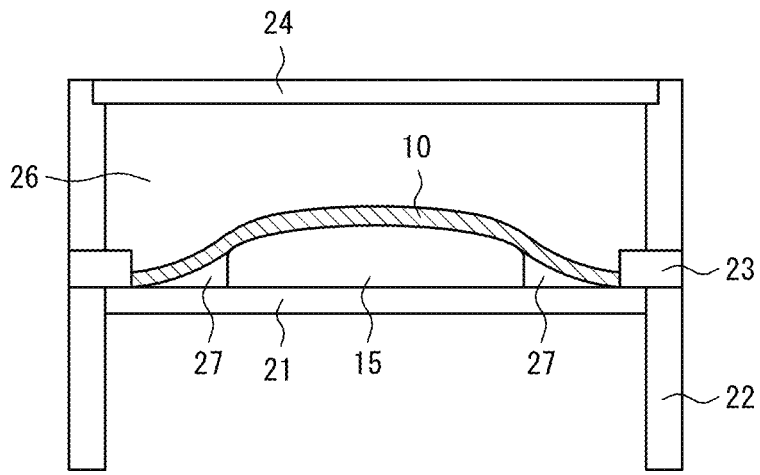
FIG. 6C is a diagram illustrating a step in the process of deforming the replica master mold illustrated in FIG. 4C.

The stage 21 moves upward, and the die 15 pushes up the replica master mold 10 supported by the supports 23, as illustrated in FIG. 6C. As a result of being pushed up by the die 15, the replica master mold 10 deforms along the shape of the die 15. Merely pushing up by the die 15, however, cannot bring the die 15 and the replica master mold 10 into close contact with each other without any gap, and there are gaps 27 between the die 15 and the replica master mold 10 in the vicinity of the ends of the die 15.

Figure 6D:
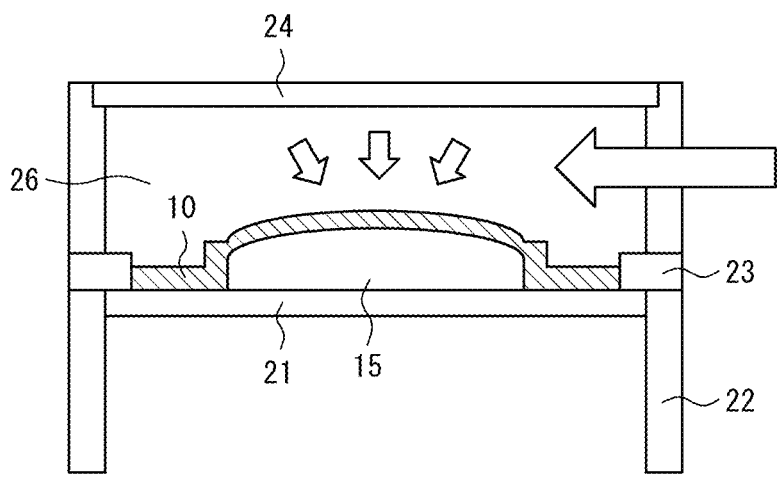
FIG. 6D is a diagram illustrating a step in the process of deforming the replica master mold illustrated in FIG. 4C.
Figure 6E:
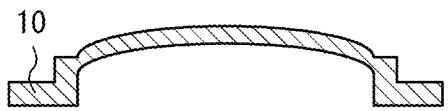
FIG. 6E is a diagram illustrating a step in the process of deforming the replica master mold illustrated in FIG. 4C.

Next, as illustrated in FIG. 6D, in a state in which the die 15 pushes up the replica master mold 10, compressed air is introduced into the region 26, to apply pressure to the replica master mold 10. This brings the die 15 and the replica master mold 10 into close contact with each other even in the vicinity of the ends of the die 15. In this state, the replica master mold 10 is cooled, and removed from the supports 23 and the die 15. The replica master mold 10 deformed along the shape of the die 15 is thus produced, as illustrated in FIG. 6E.

(Formation of Fine Structure on Formation Object)

The process of forming the fine structure on the formation object 16 illustrated in FIG. 4D is described in detail below, with reference to FIGS. 7A to 7D. The following describes an example of forming the fine structure on the formation object 16 of a three-dimensional shape. The term "formation object of a three-dimensional shape" refers to a formation object having a curved surface whose curvature radius is greater than the height of the fine structure (fine irregular pattern) formed on the replica master mold 10. As mentioned above, the replica master mold 10 is deformed in conformity with the shape of the formation object 16. Therefore, the replica master mold 10 deformed in conformity with the shape of the formation object 16 has a curved surface whose curvature radius is greater than the height of the fine structure (fine irregular pattern) formed on the replica master mold 10.

The process of forming the fine structure on the formation object 16 mainly includes an application step, a transfer step, a photo-curing step, and a release step.

Figure 7A:
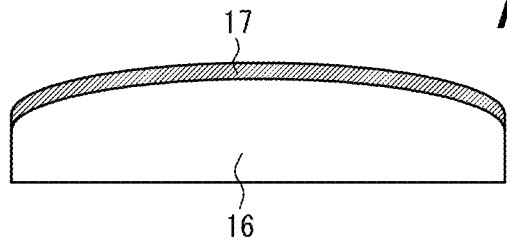
FIG. 7A is a diagram illustrating a step in a process of forming the fine structure illustrated in FIG. 4D on a formation object.

In the application step, as illustrated in FIG. 7A, the uncured photo-curable resin 17 is applied to the surface of the formation object 16. As the method of applying the photo-curable resin 17 to the formation object 16, various methods such as spray coating, inkjet coating, dispenser coating, dip coating, dropper dropping, and spin coating can be used depending on the viscosity of the photo-curable resin 17 and the shape of the formation object 16. An intermediate layer may be provided between the formation object 16 and the photo-curable resin 17, to improve the adhesiveness between the formation object 16 and the photo-curable resin 17, the optical characteristics, and the like.

Figure 7B:
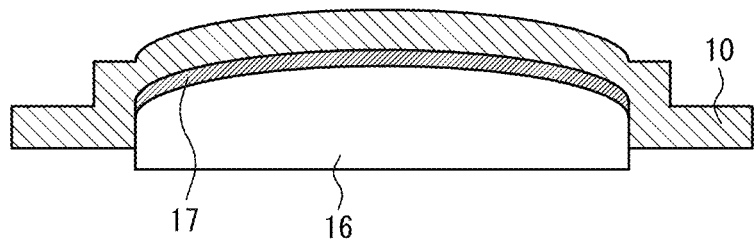
FIG. 7B is a diagram illustrating a step in the process of forming the fine structure illustrated in FIG. 4D on a formation object.

In the transfer step, as illustrated in FIG. 7B, the replica master mold 10 is pressed against the photo-curable resin 17 applied to the formation object 16. As mentioned above, the replica master mold 10 is deformed in conformity with the shape of the die 15 (formation object 16) in a state in which the surface shape body 12 faces the formation object 16. Accordingly, by pressing the replica master mold 10 against the formation object 16, the surface shape body 12 is pressed against the photo-curable resin 17. As a result of the surface shape body 12 being pressed against the photo-curable resin 17, the fine irregular pattern formed on the surface shape body 12 is transferred to the photo-curable resin 17.

Examples of the method of pressing the replica master mold 10 against the formation object 16 (photo-curable resin 17) include fluid pressurization using gas, liquid, or the like from the base material layer 11 side, pressing using an elastic solid, and pressing using a roller.

Figure 7C:
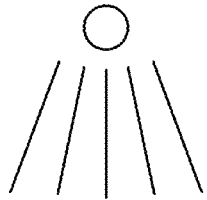
FIG. 7C is a diagram illustrating a step in the process of forming the fine structure illustrated in FIG. 4D on a formation object.
Figure 7C:
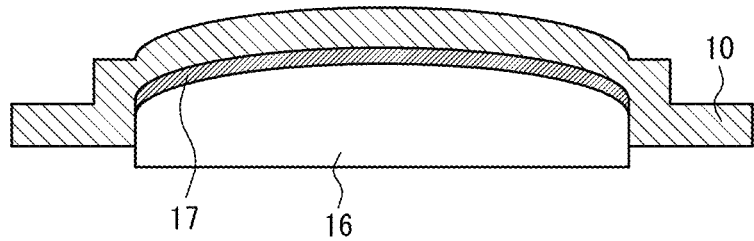

In the photo-curing step, as illustrated in FIG. 7C, in a state in which the replica master mold 10 is pressed against the photo-curable resin 17, active energy rays are applied to the photo-curable resin 17 to cure the photo-curable resin 17. The active energy rays are, for example, rays of light emitted from a light source such as a mercury lamp, a metal halide lamp, or an ultraviolet light emitting diode (LED).

In the case where the replica master mold 10 allows the active energy rays to pass through, the active energy rays may be applied to the photo-curable resin 17 from the replica master mold 10 side. In the case where the formation object 16 allows the active energy rays to pass through, the active energy rays may be applied to the photo-curable resin 17 from the formation object 16 side.

Figure 7D:
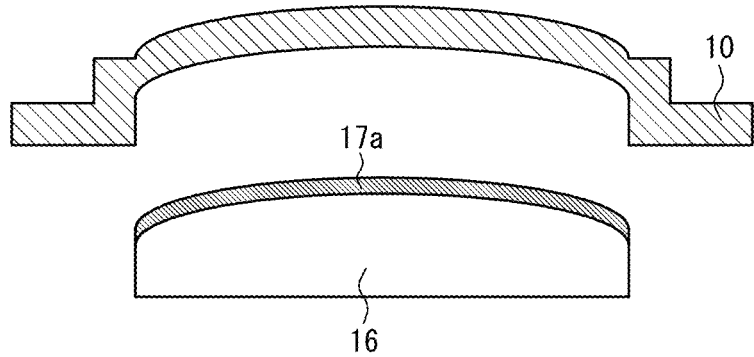
FIG. 7D is a diagram illustrating a step in the process of forming the fine structure illustrated in FIG. 4D on a formation object.

In the release step, as illustrated in FIG. 7D, the formation object 16 and the replica master mold 10 are separated from each other. On the surface of the formation object 16, the photo-curable resin 17 to which the fine irregular pattern of the surface shape body 12 of the replica master mold 10 has been transferred is cured to form a fine structure 17*a*. The formation object 16 (article) having the fine structure 17*a* formed thereon is thus manufactured.

The separation of the formation object 16 and the replica master mold 10 needs to be performed without the surface shape body 12 of the replica master mold 10 dropping off or the replica master mold 10 being damaged. In this embodiment, the replica master mold 10 is film-shaped, and therefore deforms more flexibly than conventional master molds made of quartz, metal, or the like. Hence, the replica master mold 10 is less likely to be damaged upon the release. The release of the film-shaped replica master mold 10 is typically performed by deforming and separating the replica master mold 10 from its end. The separation may be facilitated by optionally deforming the formation object 16 or spraying a fluid such as air between the replica master mold 10 and the formation object 16.

The replica master mold 10 and the formation object 16 may be bonded together to form the fine structure on the formation object 16. In this case, by attaching the replica master mold 10 to the formation object 16 with, for example, an adhesive applied to the base material layer 11 side of the replica master mold 10, the fine structure 17*a* can be formed on the formation object 16 (i.e. the replica master mold 10 attached to the formation object 16 serves as the fine structure 17*a*).

Although the foregoing embodiment describes the case where the process of deforming the replica master mold 10 in conformity with the shape of the formation object 16 and the process of forming the fine structure 17*a* on the formation object 16 using the deformed replica master mold 10 are separate steps, a modification may be made to combine these steps.

The deformation of the replica master mold 10 and the formation of the fine structure 17*a* on the formation object 16 according to a modification are described below. The deformation of the replica master mold 10 and the formation of the fine structure 17a on the formation object 16 according to this modification are performed using the device including the stage 21, the sidewalls 22, the supports 23, and the quartz plate 24 and used in the deformation of the replica master mold described with reference to FIGS. 6A to 6E.

First, the formation object 16 to which the photo-curable resin 17 has been applied is placed on the stage 21. Moreover, the replica master mold 10 is supported by the supports 23, with the surface shape body 12 facing the formation object 16.

Following this, the region 25 is vacuumed, and compressed air is introduced into the region 26. As a result of vacuuming the region 25, the stage 21 moves upward (i.e. toward the replica master mold 10 supported by the supports 23). With the movement of the stage 21, the formation object 16 to which the photo-curable resin 17 has been applied pushes up the replica master mold 10 supported by the supports 23. As mentioned above, merely pushing up the replica master mold 10 cannot eliminate a gap between the formation object 16 and the replica master mold 10. In this modification, the region 25 is vacuumed, and compressed air is introduced into the region 26. The introduction of the compressed air applies pressure to the replica master mold 10. This can bring the replica master mold 10 and the formation object 16 into close contact with each other without any gap.

Next, in a state in which the region 25 is vacuumed and compressed air is introduced into the region 26, light is applied from above the quartz plate 24. As mentioned above, the quartz plate 24 allows light to pass through. Accordingly, by forming the replica master mold 10 to allow light to pass through, too, the photo-curable resin 17 applied to the formation object 16 is irradiated with light and as a result cured.

Next, the formation object 16 and the replica master mold 10 are separated from each other. On the surface of the formation object 16, the photo-curable resin 17 to which the fine irregular pattern of the surface shape body 12 of the replica master mold 10 has been transferred is cured to form the fine structure 17a.

Although the above describes an example in which the formation object 16 has a convex surface and the fine irregular pattern is formed on the convex surface of the formation object 16, this is not a limitation. The presently disclosed technique is also applicable to the case where the formation object has a concave surface and the fine irregular pattern is formed on the concave surface. An example of forming the fine structure 17a (fine irregular pattern) on a concave surface of a concave-surfaced formation object 16A as illustrated in FIG. 8 is described below.

Figure 8:
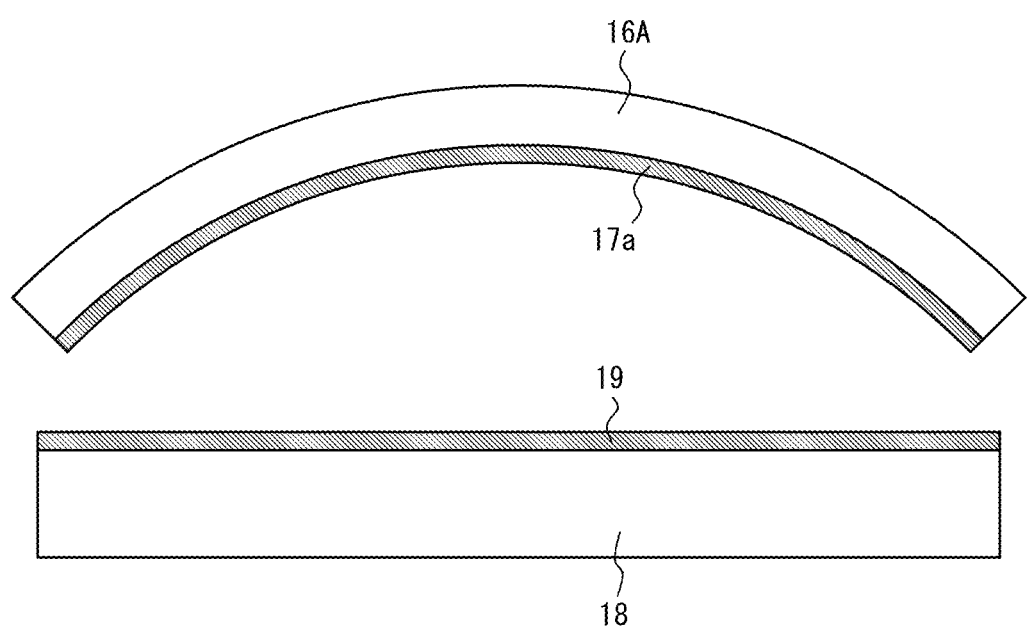
FIG. 8 is a diagram illustrating a formation object on which a fine structure is formed using the replica master mold according to one of the disclosed embodiments and an example of arrangement thereof.

The formation object 16A having the fine structure 17a (fine irregular pattern) formed on its concave surface is, for example, used as a top plate (cover) attached to the front of a display body 18 of a liquid crystal display (LCD) or the like with an air gap therebetween, as illustrated in FIG. 8. The formation object 16A is also used as an antireflection member provided on the inner side (display body side) of a touch panel. FIG. 8 illustrates an example in which a fine structure 19 for antireflection is formed on the front of the display body 18, too. The fine structure 19 includes, for example, an approximately flat base film such as a triacetylcellulose (TAC) film provided on the front of the display body 18, and a photo-curable resin (e.g. acrylic ultraviolet curable resin) provided on the base film and having a fine irregular pattern. The structure, formation method, etc. of the fine structure 19 are known to those skilled in the art and do not directly relate to the present disclosure, and so their description is omitted.

The process of deforming the replica master mold 10 in conformity with the shape of the formation object 16A is described in detail below, with reference to FIGS. 9A to 9E. The following describes a process of deforming the replica master mold 10 by push-up forming. Here, the description of the same structures in FIGS. 9A to 9E as those in FIGS. 6A to 6E is omitted.

Figure 9A:
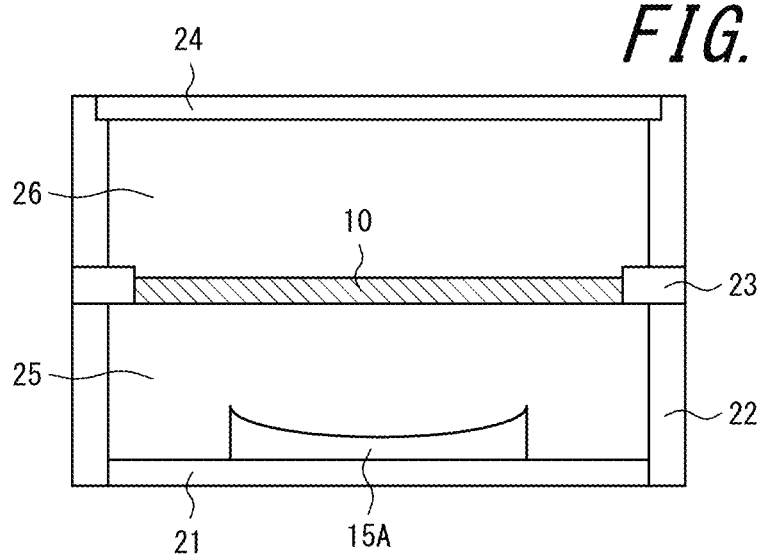
FIG. 9A is a diagram illustrating a step in a process of deforming the replica master mold to form the fine structure on the formation object illustrated in FIG. 8.

First, as illustrated in FIG. 9A, a die 15A having a concave surface that conforms to the shape of the concave surface of the formation object 16 is placed on the stage 21. The die 15A is supported with its concave surface facing the replica master mold 10 supported by the supports 23. The replica master mold 10 is supported with the surface shape body 12 facing the die 15A.

Next, the replica master mold 10 supported by the supports 23 is heated to a temperature higher than or equal to the softening temperature of the base material layer 11 and lower than the softening temperature of the surface shape body 12. As mentioned above, the softening temperature of the surface shape body 12 is higher than the softening temperature of the base material layer 11. Accordingly, the base material layer 11 softens, but the surface shape body 12 does not soften. Hence, no distortion of the shape of the fine irregular pattern formed on the surface of the surface shape body 12 occurs.

Figure 9B:
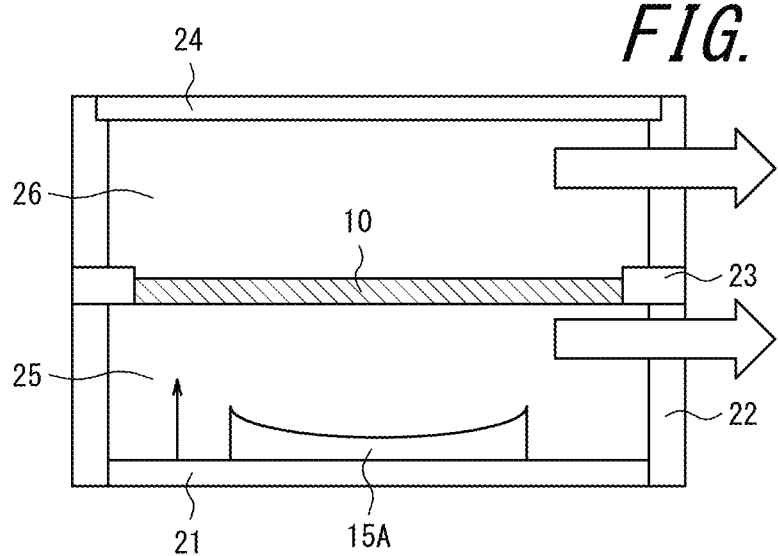
FIG. 9B is a diagram illustrating a step in the process of deforming the replica master mold to form the fine structure on the formation object illustrated in FIG. 8.

Next, as illustrated in FIG. 9B, the regions 25 and 26 are vacuumed. The stage 21 is movable vertically along the sidewalls 22, as mentioned above. As a result of vacuuming the region 25, the stage 21 moves upward (i.e. toward the replica master mold 10 supported by the supports 23).

Figure 9C:
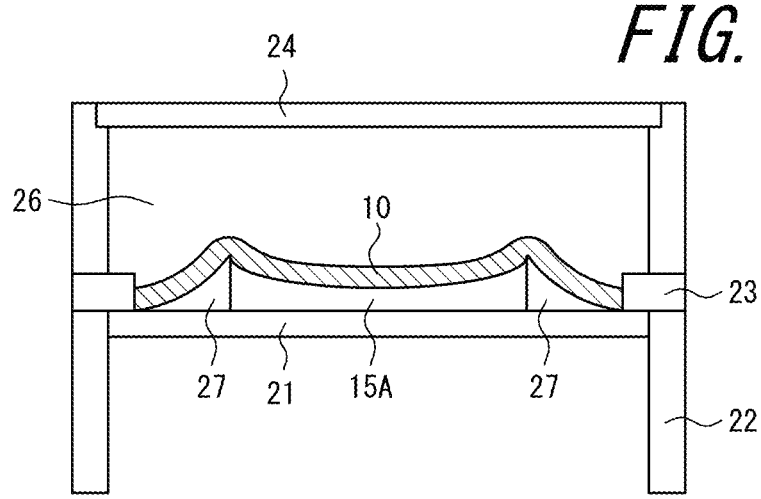
FIG. 9C is a diagram illustrating a step in the process of deforming the replica master mold to form the fine structure on the formation object illustrated in FIG. 8.

The stage 21 moves upward, and the die 15A pushes up the replica master mold 10 supported by the supports 23, as illustrated in FIG. 9C. As a result of being pushed up by the die 15A, the replica master mold 10 deforms along the shape of the die 15A (i.e. the concave surface of the die 15A). Merely pushing up by the die 15A, however, cannot bring the die 15A and the replica master mold 10 into close contact with each other without any gap, and there are gaps 27 between the die 15A and the replica master mold 10 in the vicinity of the ends of the die 15A.

Figure 9D:
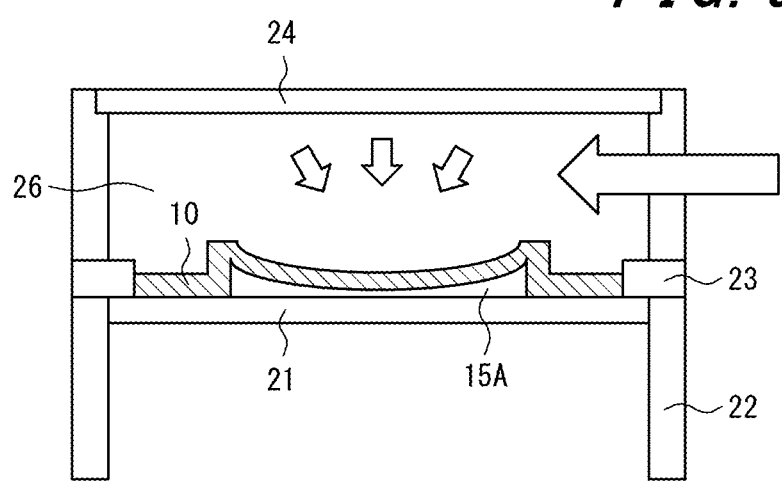
FIG. 9D is a diagram illustrating a step in the process of deforming the replica master mold to form the fine structure on the formation object illustrated in FIG. 8.
Figure 9E:
FIG. 9E is a diagram illustrating a step in the process of deforming the replica master mold to form the fine structure on the formation object illustrated in FIG. 8.

Next, as illustrated in FIG. 9D, in a state in which the die 15A pushes up the replica master mold 10, compressed air is introduced into the region 26, to apply pressure to the replica master mold 10. This brings the die 15A and the replica master mold 10 into close contact with each other even in the vicinity of the ends of the die 15A. In this state, the replica master mold 10 is cooled, and removed from the supports 23 and the die 15A. The replica master mold 10 deformed along the shape of the die 15A is thus produced, as illustrated in FIG. 9E.

The process of forming the fine structure on the concave surface of the formation object 16A is described in detail below, with reference to FIGS. 10A to 10D. In FIGS. 10A to 10D, the same structures as those in FIGS. 7A to 7D are given the same reference signs, and their description is omitted.

The process of forming the fine structure on the formation object 16A mainly includes an application step, a transfer step, a photo-curing step, and a release step.

Figure 10A:
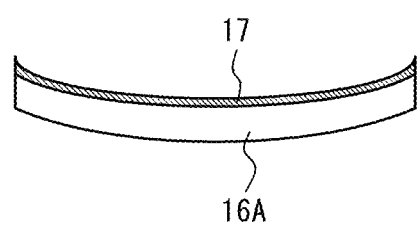
FIG. 10A is a diagram illustrating a step in a process of forming the fine structure on the formation object illustrated in FIG. 8.

In the application step, as illustrated in FIG. 10A, the uncured photo-curable resin 17 is applied to the concave surface of the formation object 16A. As the method of applying the photo-curable resin 17 to the formation object 16A, various methods such as spray coating, inkjet coating, dispenser coating, dip coating, dropper dropping, and spin coating can be used depending on the viscosity of the photo-curable resin 17 and the shape of the formation object 16A. An intermediate layer may be provided between the formation object 16A and the photo-curable resin 17, to improve the adhesiveness between the formation object 16A and the photo-curable resin 17, the optical characteristics, and the like.

Figure 10B:
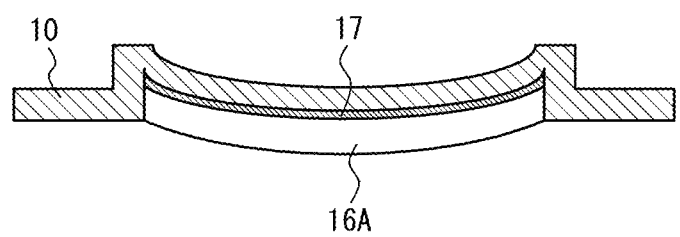
FIG. 10B is a diagram illustrating a step in the process of forming the fine structure on the formation object illustrated in FIG. 8.

In the transfer step, as illustrated in FIG. 10B, the replica master mold 10 is pressed against the photo-curable resin 17 applied to the formation object 16A. As mentioned above, the replica master mold 10 is deformed in conformity with the shape of the die 15A (formation object 16A) in a state in which the surface shape body 12 faces the formation object 16A. Accordingly, by pressing the replica master mold 10 against the formation object 16A, the surface shape body 12 is pressed against the photo-curable resin 17. As a result of the surface shape body 12 being pressed against the photo-curable resin 17, the fine irregular pattern formed on the surface shape body 12 is transferred to the photo-curable resin 17.

Figure 10C:
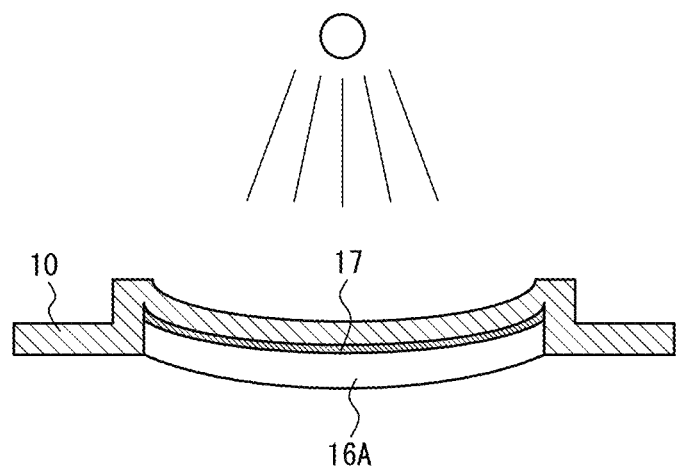
FIG. 10C is a diagram illustrating a step in the process of forming the fine structure on the formation object illustrated in FIG. 8.

In the photo-curing step, as illustrated in FIG. 10C, in a state in which the replica master mold 10 is pressed against the photo-curable resin 17, active energy rays (e.g. ultraviolet light) are applied to the photo-curable resin 17 to cure the photo-curable resin 17.

Figure 10D:
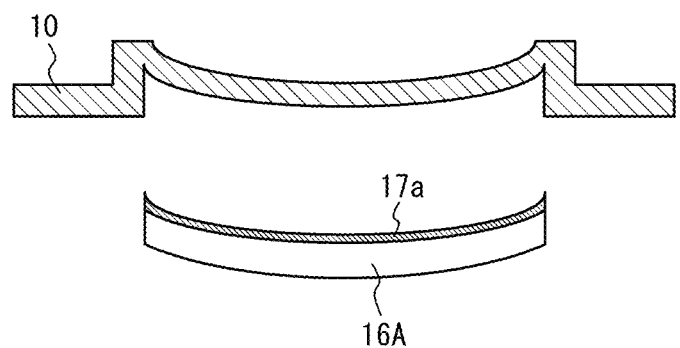
FIG. 10D is a diagram illustrating a step in the process of forming the fine structure on the formation object illustrated in FIG. 8.

In the release step, as illustrated in FIG. 10D, the formation object 16A and the replica master mold 10 are separated from each other. On the surface of the formation object 16A, the photo-curable resin 17 to which the fine irregular pattern of the surface shape body 12 of the replica master mold 10 has been transferred is cured to form the fine structure 17a. The formation object 16A (article) having the fine structure 17a formed thereon is thus manufactured.

The process of deforming the replica master mold 10 in conformity with the shape of the formation object 16A and the process of forming the fine structure 17a on the formation object 16A using the deformed replica master mold 10 may be combined.

First, the photo-curable resin 17 is applied to the concave surface of the formation object 16A by spin coating or the like. The formation object 16A having the photo-curable resin 17 applied to its concave surface is then placed on the stage 21 of the device illustrated in FIGS. 6A to 6D or FIGS. 9A to 9D. The replica master mold 10 is supported by the supports 23, with the surface shape body 12 facing the formation object 16A.

Following this, the region 25 is vacuumed, and compressed air is introduced into the region 26 (vacuum differential pressure). As a result of vacuuming the region 25, the stage 21 moves upward (i.e. toward the replica master mold 10 supported by the supports 23). With the movement of the stage 21, the formation object 16A to which the photo-curable resin 17 has been applied pushes up the replica master mold 10 supported by the supports 23. As mentioned above, merely pushing up the replica master mold 10 cannot eliminate a gap between the formation object 16A and the replica master mold 10. In view of this, the region 25 is vacuumed, and compressed air is introduced into the region 26. The introduction of the compressed air applies pressure to the replica master mold 10. This can bring the replica master mold 10 and the formation object 16A into close contact with each other without any gap.

Next, in a state in which the region 25 is vacuumed and compressed air is introduced into the region 26, light is applied from above the quartz plate 24. As mentioned above, the quartz plate 24 allows light to pass through. Accordingly, by forming the replica master mold 10 to allow light to pass through, too, the photo-curable resin 17 applied to the formation object 16A is irradiated with light and as a result cured.

Next, the formation object 16A and the replica master mold 10 are separated from each other. On the surface (concave surface) of the formation object 16A, the photo-curable resin 17 to which the fine irregular pattern of the surface shape body 12 of the replica master mold 10 has been transferred is cured to form the fine structure 17a.

As described above, in this embodiment, the replica master mold 10 includes the base material layer 11 and the surface shape body 12 formed on the base material layer 11 and having the fine irregular pattern, and the softening temperature of the surface shape body 12 is higher than the softening temperature of the base material layer 11.

Hence, in the case of heating the replica master mold 10 in order to deform the replica master mold 10, by heating the replica master mold 10 at a temperature higher than or equal to the softening temperature of the base material layer 11 and lower than the softening temperature of the surface shape body 12, the replica master mold 10 can be deformed with only the base material layer 11 being softened. Since the surface shape body 12 does not soften, the shape of the fine irregular pattern is not distorted, and a decrease in transfer accuracy caused by a distortion of the fine irregular pattern can be suppressed.

EXAMPLES

More detailed description is given below by way of examples and comparative examples, although the present disclosure is not limited to these examples.
(Production of Master Mold)
The production of the master mold 14 is described below.
A glass base material (glass roll master mold) of 126 mm in outer diameter was prepared. A diluted resist obtained by diluting a photoresist to $1/10$ in mass ratio by a thinner was applied to the surface of the glass roll master mold by dipping so as to have an average thickness of about 70 nm on the cylindrical surface of the glass roll master mold, to form a resist layer. The glass roll master mold having the resist layer formed thereon was then conveyed to an exposure device, and the resist layer was exposed to pattern, on the resist layer, a spiral latent image having a hexagonal lattice pattern between adjacent three tracks. In detail, the region subjected to the formation of the hexagonal lattice exposure pattern was irradiated with laser light of 0.50 mW/m, to form the hexagonal lattice exposure pattern.

Next, a development treatment was performed on the resist layer on the glass roll master mold, to dissolve the resist layer in the exposed portion and develop the resist layer. In detail, the undeveloped glass roll master mold was placed on a turntable of a development device and, while rotating the turntable, a developer was dropped on the surface of the glass roll master mold to develop the resist layer. In this way, the glass roll master mold with the resist layer being open in the hexagonal lattice pattern was obtained.

Next, plasma etching was performed in a $CHF_3$ gas atmosphere using a roll etching device. As a result, on the surface of the glass roll master mold, etching progressed only in the hexagonal lattice pattern portion exposed from the resist layer, whereas the other regions were not etched as the resist layer served as a mask. An elliptical cone-shaped concave portion was thus formed in the glass roll master mold. In the etching, the etching amount (depth) was adjusted based on the etching time. Lastly, the resist layer was removed by oxygen ashing, thus obtaining the glass roll master mold (master mold) having the concave hexagonal lattice pattern.

(Production and Deformation of Replica Master Mold)

A replica master mold was produced using the glass roll master mold (master mold) obtained as described above, and deformed in conformity with the shape of a formation object. The production of a replica master mold and the deformation (preforming) of the replica master mold according to each of the examples and comparative examples are described below. The softening temperature was measured as follows: A film-shaped sample produced with a thickness of 50 μm to 200 μm was stamped into 40 mm×0.5 mm. The dynamic viscoelasticity E' was measured using a dynamic viscoelasticity measurement device (product name "Rheometrics System Analyzer-3 (RSA-3)" produced by Texas Instruments Inc.), and the temperature corresponding to dynamic viscoelasticity E'=0.3 GPa was taken to be the softening temperature.

Example 1

In this example, a PVC film (softening temperature: 84° C.) of 200 μm in average thickness was used as the base material layer 11. An ultraviolet curable resin composition (softening temperature: 116° C.) was dropped on the PVC film using a dropper. The ultraviolet curable resin composition contains 90 parts by mass ester acrylate (product name "SP-10" produced by DIC Corporation) and 10 parts by mass fluorineacrylate monomer (product name "FAAC-6" produced by Unimatec Corporation).

After this, the PVC film on which the ultraviolet curable resin composition had been dropped and the above-described glass roll master mold having the concave hexagonal lattice pattern were brought into close contact with each other. Ultraviolet rays were applied from the PVC film (base material layer) side at an irradiance level of 1500 mJ/cm$^2$ using a metal halide lamp, to cure the ultraviolet curable resin composition. Subsequently, the glass roll master mold was separated from the cured ultraviolet curable resin composition. As a result of this process, a replica master mold in which the cured ultraviolet curable resin composition as the surface shape body 12 was formed on the PVC film as the base material layer 11 was obtained.

The obtained replica master mold was then deformed in conformity with the shape of the formation object 16. In this example, a convex lens with an outer diameter of 12.7 mm and an F value of 15 was used as the formation object 16, and the replica master mold was deformed by push-up forming at a deformation process temperature of 120° C.

Example 2

In this example, the intermediate layer 13 having the fine irregular pattern was formed as illustrated in FIGS. 3A and 3B, and the surface shape body 12 was formed on the intermediate layer 13, to produce a replica master mold. In detail, a PMMA film (softening temperature: 102° C.) was used as the base material layer 11. A layer made of PC (softening temperature: 148° C.) and a layer made of an ultraviolet curable resin (product name "SK1900" produced by Dexerials Corporation) (softening temperature: 157° C.) were formed on the PMMA film, as the intermediate layer. The PMMA film having the intermediate layer formed thereon and the glass roll master mold were then brought into close contact with each other. Ultraviolet rays were applied from the PMMA film (base material layer) side at an irradiance level of 1500 mJ/cm$^2$ using a metal halide lamp, to cure the ultraviolet curable resin. As a result of this process, the intermediate layer having the fine irregular pattern was formed. A tungsten oxide layer (softening temperature: 1473° C.) which is an inorganic compound was then formed as the surface shape body 12 on the intermediate layer having the fine irregular pattern, to obtain a replica master mold.

The obtained replica master mold was then deformed in conformity with the shape of the same convex lens as in Example 1. In this example, the replica master mold was deformed by push-up forming at a deformation process temperature of 190° C.

Example 3

In this example, the approximately flat intermediate layer 13 was formed as illustrated in FIG. 2, and the surface shape body 12 was formed on the intermediate layer 13, to produce a replica master mold. In detail, a PET film (softening temperature: 125° C.) of 188 μm in average thickness was used as the base material layer 11. An intermediate layer (easily adhesive layer) for improving adhesiveness was formed on the PET film, and an ultraviolet curable resin (product name "SK1900" produced by Dexerials Corporation) (softening temperature: 157° C.) was applied onto the intermediate layer.

The PET film having the ultraviolet curable resin applied thereon and the glass roll master mold were then brought into close contact with each other. Ultraviolet rays were applied from the PET film (base material layer) side at an irradiance level of 1500 mJ/cm$^2$ using a metal halide lamp, to cure the ultraviolet curable resin. As a result of this process, a replica master mold in which the cured ultraviolet curable resin as the surface shape body 12 was formed on the PET film as the base material layer 11 was obtained.

The obtained replica master mold was then deformed in conformity with the shape of the same convex lens as in Example 1. In this example, the replica master mold was deformed by push-up forming at a deformation process temperature of 160° C.

Comparative Example 1

In this comparative example, a COC film (softening temperature: 128° C.) of 100 μm in average thickness was used as the base material layer 11. A single-layer base material (softening temperature: 128° C.) having a fine irregular pattern was formed on the COC film as the surface shape body 12, to obtain a replica master mold. In this comparative example, the softening temperature of the COC film as the base material layer 11 and the softening temperature of the single-layer base material as the surface shape body 12 are the same.

The obtained replica master mold was then deformed in conformity with the shape of the same convex lens as in Example 1. In this example, the replica master mold was deformed with a vacuum differential pressure of 0.1 MPa at a deformation process temperature of 150° C.

Comparative Example 2

In this comparative example, a PET film (product name "COSMOSHINE A4300" produced by Toyobo Co., Ltd.) (softening temperature: 184° C.) was used as the base material layer 11. An intermediate layer (easily adhesive layer) for improving adhesiveness was formed on the PET film, and an ultraviolet curable resin (product name "SK1900" produced by Dexerials Corporation) (softening temperature: 157° C.) was applied onto the intermediate layer, as in Example 3.

The PET film having the ultraviolet curable resin applied thereon and the glass roll master mold were then brought into close contact with each other. Ultraviolet rays were applied from the PET film (base material layer) side at an irradiance level of 1500 mJ/cm$^2$ using a metal halide lamp, to cure the ultraviolet curable resin. As a result of this process, a replica master mold in which the cured ultraviolet curable resin as the surface shape body 12 was formed on the PET film as the base material layer 11 was obtained.

The obtained replica master mold was then deformed in conformity with the shape of the same convex lens as in Example 1. In this comparative example, the replica master mold was deformed by push-up forming with a vacuum differential pressure of 0.1 MPa at a deformation process temperature of 220° C.

The evaluation results of the replica master molds produced and deformed according to Examples 1 to 3 and Comparative Examples 1 and 2 described above are explained below.

Figure 11A:
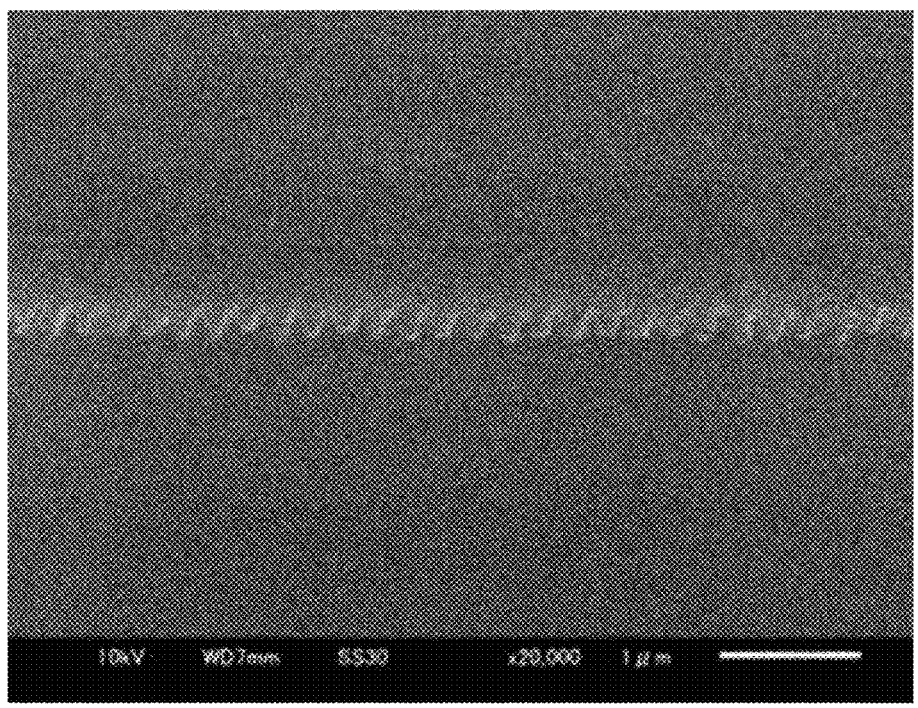
FIG. 11A is a cross-section photograph of a fine irregular pattern before and after preforming of a replica master mold according to Example 1.
Figure 11A:
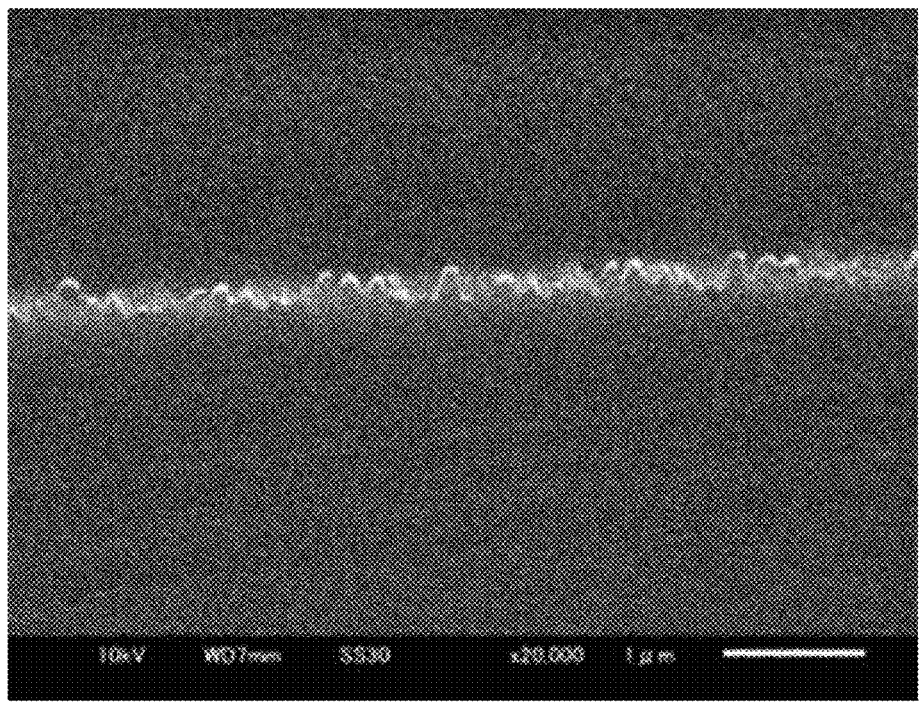
Figure 11B:
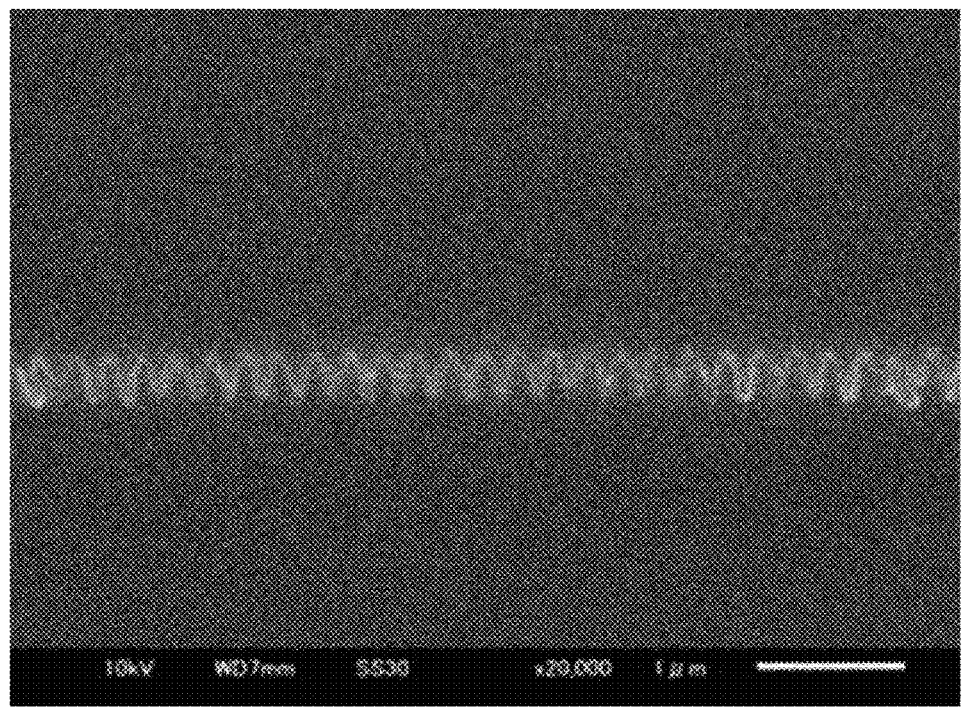
FIG. 11B is a cross-section photograph of a fine irregular pattern before and after preforming of a replica master mold according to Example 2.
Figure 11B:
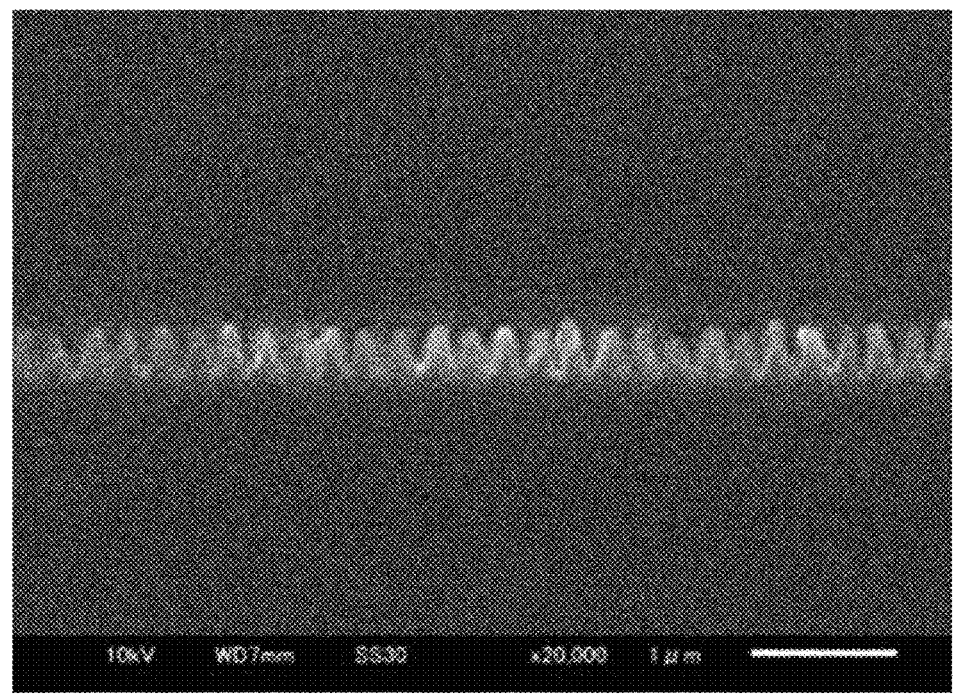
Figure 11C:
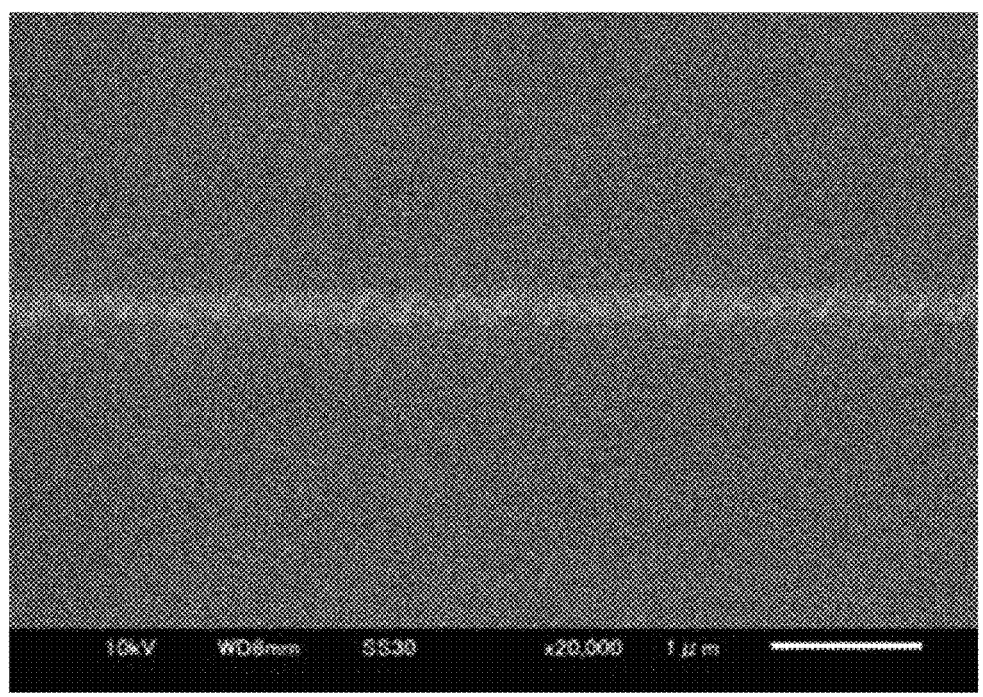
FIG. 11C is a cross-section photograph of a fine irregular pattern before and after preforming of a replica master mold according to Example 3.
Figure 11C:
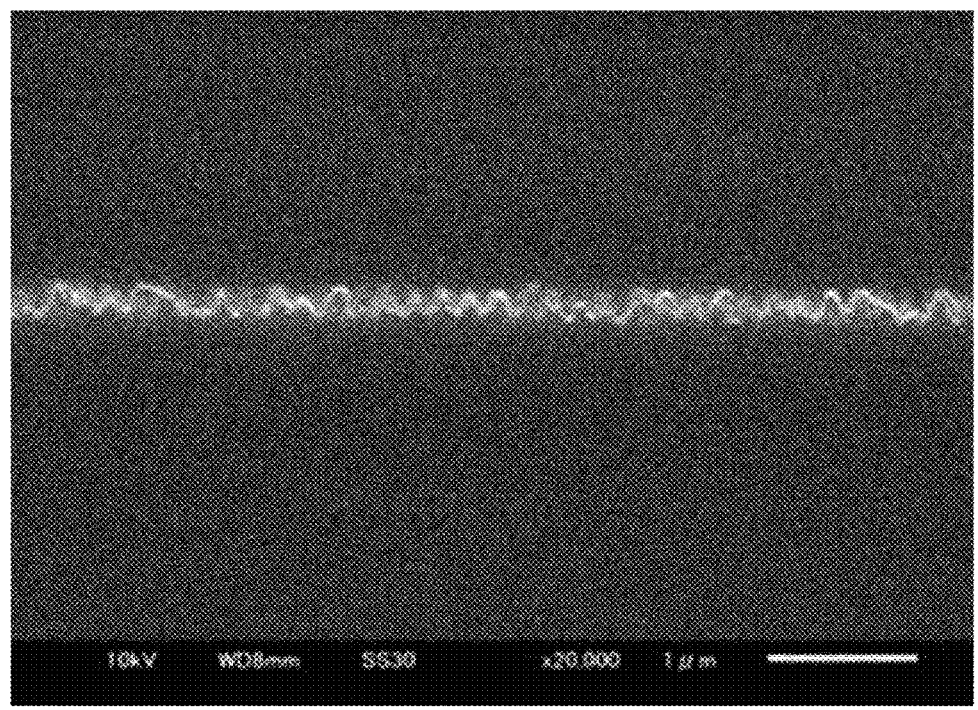
Figure 11D:
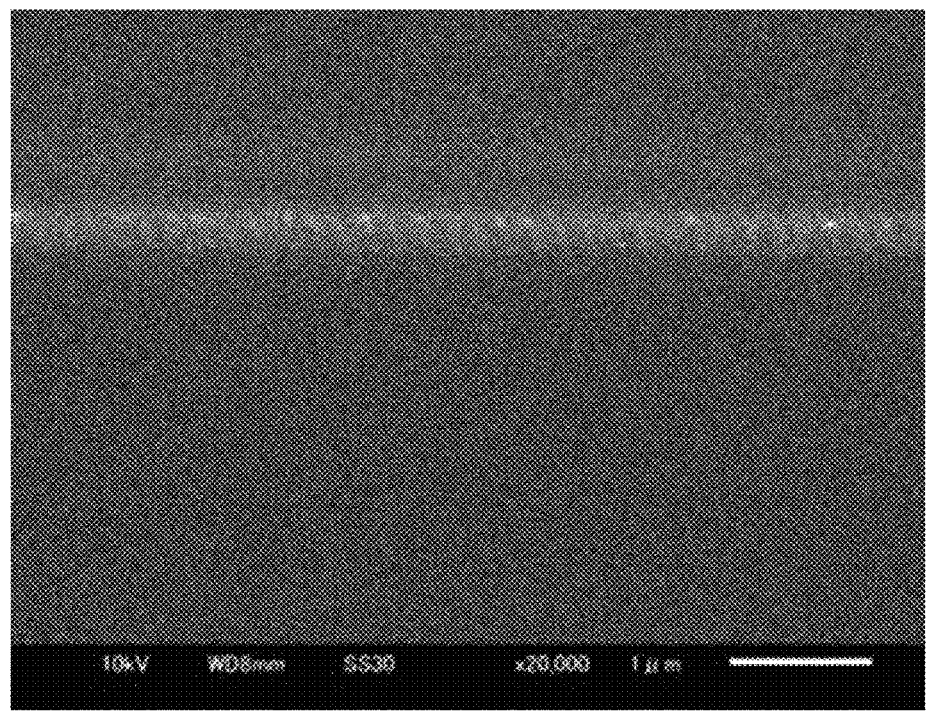
FIG. 11D is a cross-section photograph of a fine irregular pattern before and after preforming of a replica master mold according to Comparative Example 1.
Figure 11D:
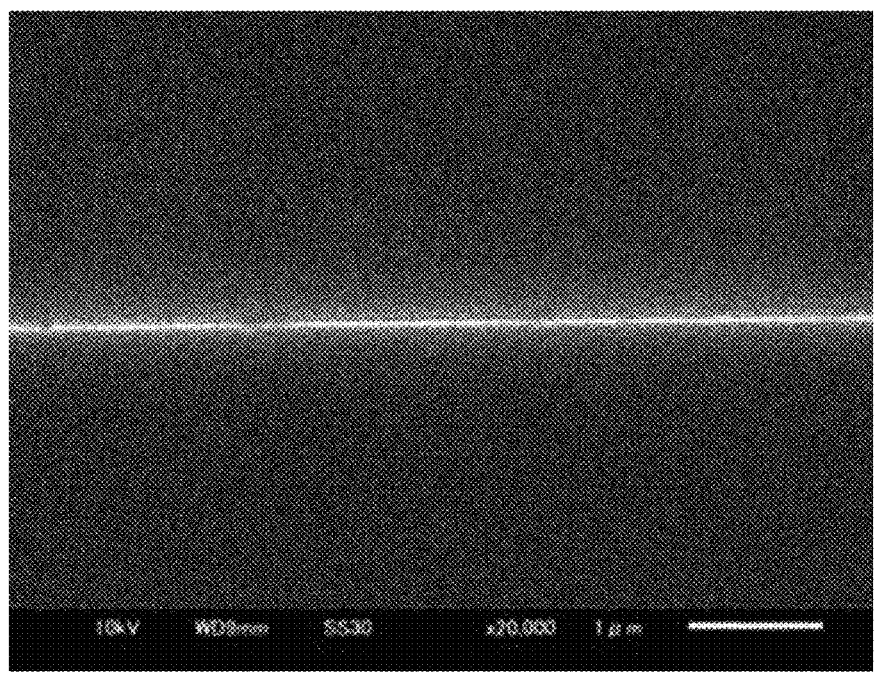
Figure 11E:
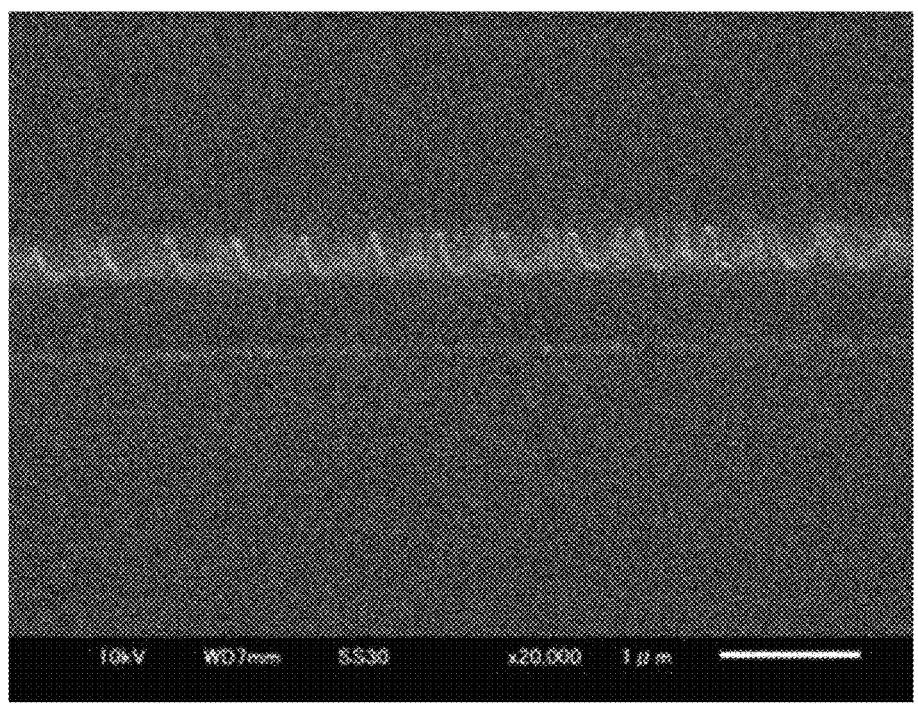
FIG. 11E is a cross-section photograph of a fine irregular pattern before and after preforming of a replica master mold according to Comparative Example 2.
Figure 11E:
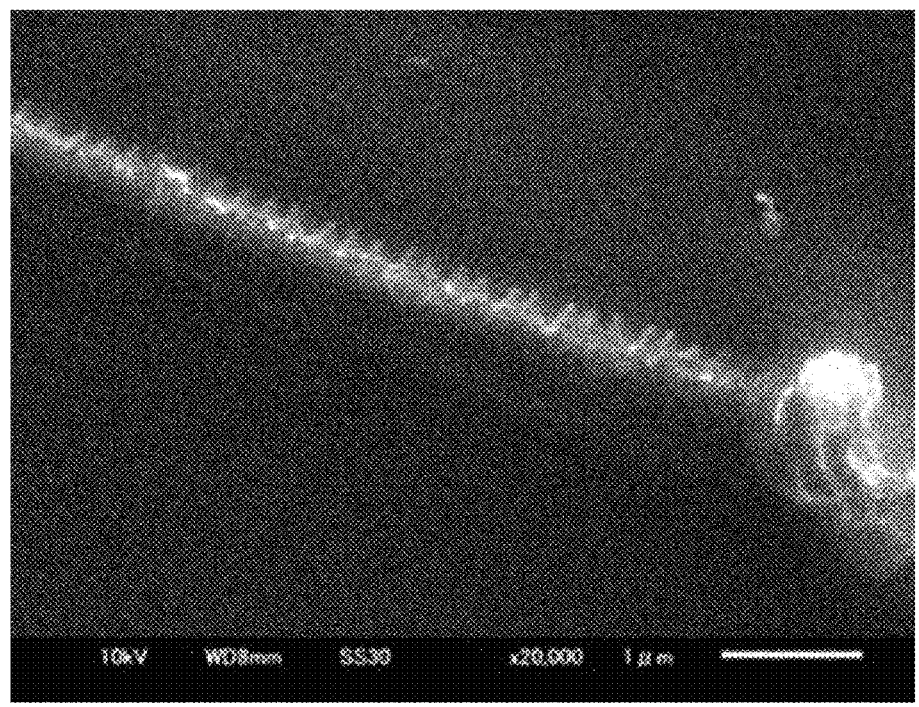

FIG. 11A is a cross-section photograph of the fine irregular pattern before and after preforming of the replica master mold according to Example 1, taken by a scanning electron microscope (SEM). FIG. 11B is a cross-section photograph of the fine irregular pattern before and after preforming of the replica master mold according to Example 2. FIG. 11C is a cross-section photograph of the fine irregular pattern before and after preforming of the replica master mold according to Example 3. FIG. 11D is a cross-section photograph of the fine irregular pattern before and after preforming of the replica master mold according to Comparative Example 1. FIG. 11E is a cross-section photograph of the fine irregular pattern before and after preforming of the replica master mold according to Comparative Example 2. In FIGS. 11A to 11E, the photographed image after preforming of the replica master mold is a photographed image of a vertex portion of the convex lens.

Table 1 shows the height of the fine irregular pattern before preforming, the height of the fine irregular pattern after preforming, the residual factor which is the ratio of the height of the fine irregular pattern before preforming and the height of the fine irregular pattern after preforming, and the visual evaluation result of the deformed replica master mold, for each of the replica master molds according to Examples 1 to 3 and Comparative Examples 1 and 2.

TABLE 1

|  | Example 1 | Example 2 | Example 3 | Comparative Example 1 | Comparative Example 2 |
|---|---|---|---|---|---|
| Height of fine irregular pattern before preforming (nm) | 230 | 370 | 258 | 258 | 294 |
| Height of fine irregular pattern after preforming (nm) | 225 | 365 | 258 | 0 | 196 |
| Residual factor | 98% | 99% | 100% | 0% | 67% |
| Evaluation result | Good | Good | Good | Poor | Poor |

As illustrated in FIGS. 11A to 11C and Table 1, in Examples 1 to 3, the fine irregular pattern was transferred to the replica master mold with no distortion of the fine irregular pattern between before and after preforming (high residual factor). Thus, the fine irregular pattern was formed while the replica master mold maintained the three-dimensional shape.

As illustrated in FIGS. 11D and 11E and Table 1, in Comparative Examples 1 and 2, the fine irregular pattern was distorted between before and after preforming (low residual factor).

Moreover, in Examples 1 to 3, the replica master mold was deformed in conformity with the shape of the formation object (evaluation result: "good"). In Comparative Examples 1 and 2, on the other hand, the replica master mold was not deformed in conformity with the shape of the formation object (evaluation result: "poor"). The evaluation result "good" indicates that the replica master mold had no wrinkles or cracks and was in contact with the die throughout the curved surface.

Next, using the replica master mold according to Example 2 and the replica master mold according to Comparative Example 1, a fine structure was formed on the above-described convex lens as a formation object, and the optical characteristics (reflectance characteristics) of the formed fine structure were evaluated.

In the formation of the fine structure on the convex lens, an ultraviolet curable resin (product name "SK1120" produced by Dexerials Corporation) was applied onto the convex lens, and each of the replica master mold according to Example 2 and the replica master mold according to Comparative Example 1 was pressed against the ultraviolet curable resin. Ultraviolet rays were then applied from the base material layer side at an irradiance level of 1500 mJ/cm$^2$, to cure the ultraviolet curable resin. Subsequently, the replica master mold was separated to obtain the convex lens on which the fine structure made of the cured ultraviolet curable resin was formed.

Figure 12A:
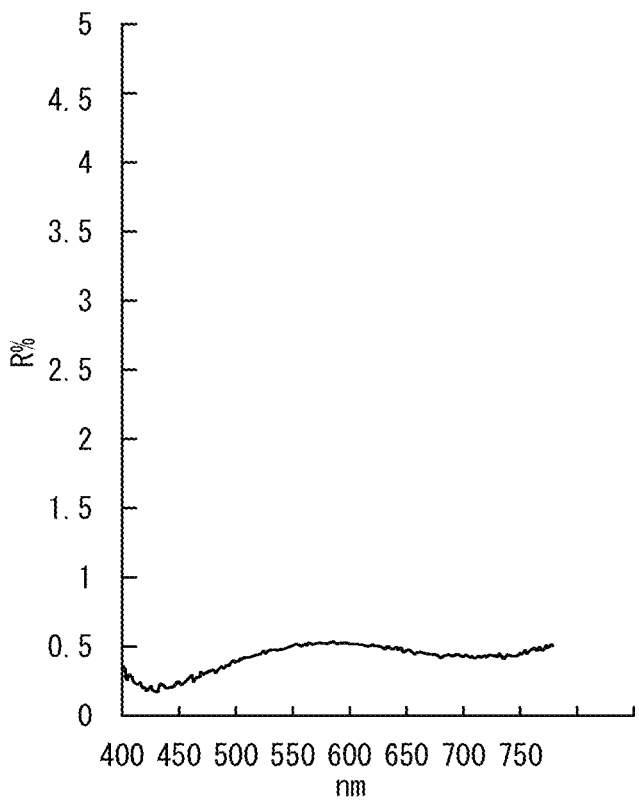
FIG. 12A is a diagram illustrating the reflectance characteristics of a fine structure formed using the replica master mold according to Example 2.
Figure 12B:
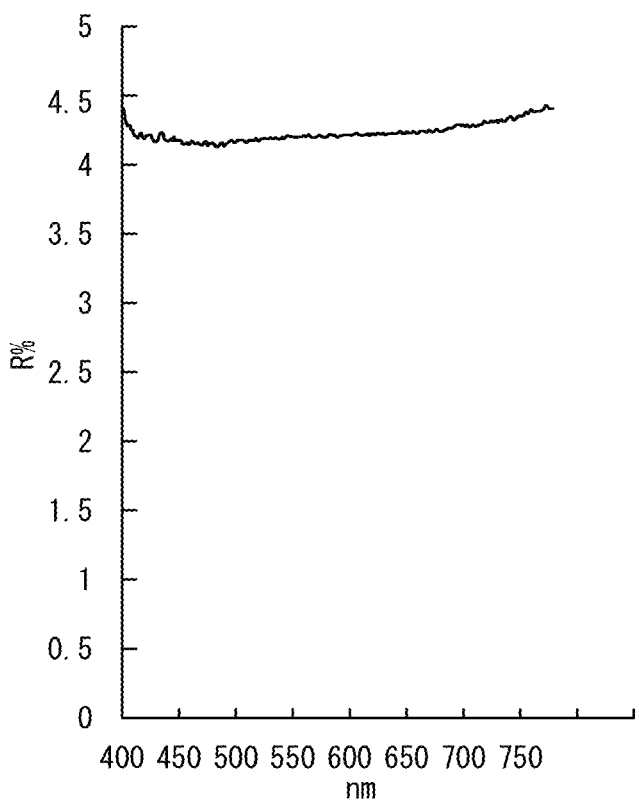
FIG. 12B is a diagram illustrating the reflectance characteristics of a fine structure formed using the replica master mold according to Comparative Example 1.

FIG. 12A is a diagram illustrating the reflection characteristics of the fine structure formed using the replica master mold according to Example 2. FIG. 12B is a diagram illustrating the reflection characteristics of the fine structure formed using the replica master mold according to Comparative Example 1.

As illustrated in FIG. 12B, the fine structure formed using the replica master mold according to Comparative Example 1 had a reflectance of about 4.2%. On the other hand, the fine structure formed using the replica master mold according to Example 2 had a reflectance of about 0.5%, exhibiting good antireflection optical characteristics. As mentioned above, in the replica master mold according to Comparative Example 1, the fine irregular pattern was distorted. This caused a distortion of the irregular shape of the fine structure formed using the replica master mold according to Comparative Example 1, and made it impossible to achieve good reflectance characteristics. In the replica master mold according to Example 2, on the other hand, the fine irregular pattern was hardly distorted. Consequently, the irregular shape of the fine structure formed using the replica master mold according to Example 2 was not distorted, so that good reflectance characteristics were achieved.

Example 4

The presently disclosed technique is applicable not only to the formation of a fine structure on the convex surface of the convex-surfaced formation object 16 but also to the formation of a fine structure on the concave surface of the concave-surfaced formation object 16A, as mentioned earlier. In this example, a fine structure is formed on a concave surface. The process of deforming the replica master mold 10 in conformity with the shape of the formation object 16A and the process of forming the fine structure 17a on the formation object 16A using the deformed replica master mold 10 were combined in this example.

In this example, a plate made of polycarbonate and having a cylindrical shape was used as the formation object 16A. This plate is, for example, used as a top plate (cover) attached to the front of a display body of a LCD or the like with an air gap therebetween. The formation object 16A used had a curvature radius R of 500 mm, a length in the curvature radius R direction of 200 mm, and a width (depth) of 140 mm.

First, an uncured acrylic ultraviolet curable resin was applied onto the concave surface of the formation object 16A by spin coating. The spin coating was performed by rotating the formation object 16A at 1000 rpm for 30 sec.

Following this, the formation object 16A having the acrylic ultraviolet curable resin applied on its concave surface was placed on the stage 21, and the regions 25 and 26 were vacuumed to −0.1 MPa by a rotary pump. By vacuuming the regions 25 and 26, the formation object 16A placed on the stage 21 was pressed against the replica master mold supported by the supports 23. In this example, a PET film (product name "A4300" produced by Toyobo Co., Ltd.) of 100 μm in average thickness was used as the replica master mold (film mold).

Atmospheric pressurization was then performed on the film mold side, i.e., the region 26 side. This enables the film mold and the formation object 16A to be in close contact with each other without any gap.

After this, in a state in which the film mold and the formation object 16A were in close contact with each other, ultraviolet light was applied from the film mold side. A metal halide lamp was used as an ultraviolet light source, and ultraviolet rays were applied at an irradiance level of 1000 mJ/cm$^2$. As a result of being irradiated with the ultraviolet light, the uncured acrylic ultraviolet curable resin applied on the concave surface of the formation object 16A cured. The film mold was then separated from the formation object 16A. As a result of this process, a fine structure with a pitch of 150 nm to 230 nm and a height of 200 nm to 250 nm was formed on the concave surface of the formation object 16A.

While the disclosed techniques have been described above by way of drawings and embodiments, various changes or modifications may be easily made by those of ordinary skill in the art based on the present disclosure. Such various changes or modifications are therefore included in the scope of the present disclosure.

REFERENCE SIGNS LIST 10 replica master mold
10a laminate
11 base material layer
12 surface shape body
12a resin layer
13 intermediate layer
14 master mold
15, 15A die
16, 16A formation object
17 photo-curable resin
17a, 19 fine structure
18 display body
21 stage
22 sidewall
23 support
24 quartz plate
25, 26 region
27 gap

The invention claimed is:

1. A replica master mold, comprising:
a base material layer; and
a surface shape body formed on the base material layer and having a fine irregular pattern,
wherein a softening temperature of the surface shape body is higher than a softening temperature of the base material layer, and
a plurality of intermediate layers made of different materials is formed between the base material layer and the surface shape body, and
a softening temperature of the plurality of intermediate layers is lower than the softening temperature of the surface shape body and is higher than the softening temperature of the base material layer.

2. The replica master mold according to claim 1, wherein the base material layer has flexibility.

3. The replica master mold according to claim 1, wherein a release layer is formed on a surface of the fine irregular pattern of the surface shape body.

4. The replica master mold according to claim 1, wherein the surface shape body is made of an inorganic compound.

5. The replica master mold according to claim 1, wherein the base material layer has an elongation percentage of 10% or more.

6. The replica master mold according to claim 1, wherein the replica master mold has a curved surface whose curvature radius is greater than a height of the fine irregular pattern.

7. A replica master mold, comprising:
a base material layer; and
a surface shape body formed on the base material layer and having a fine irregular pattern,
wherein a softening temperature of the surface shape body is higher than a softening temperature of the base material layer,
the difference between the softening temperature of the surface shape body and the softening temperature of the base material layer is greater than 0° C. and less than 1325° C.,
a plurality of intermediate layers made of different materials is formed between the base material layer and the surface shape body, and
a softening temperature of the plurality of intermediate layers is lower than the softening temperature of the surface shape body and is higher than the softening temperature of the base material layer.

* * * * *